US010211281B2

(12) United States Patent
Tao et al.

(10) Patent No.: US 10,211,281 B2
(45) Date of Patent: Feb. 19, 2019

(54) ISOLATION DEVICE

(71) Applicant: Avago Technologies International Sales Pte. Limited, Singapore (SG)

(72) Inventors: Qian Tao, Singapore (SG); Fun Kok Chow, Singapore (SG)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 715 days.

(21) Appl. No.: 14/681,791

(22) Filed: Apr. 8, 2015

(65) Prior Publication Data

US 2015/0214292 A1 Jul. 30, 2015

Related U.S. Application Data

(63) Continuation of application No. 14/063,562, filed on Oct. 25, 2013, now Pat. No. 9,087,853.

(51) Int. Cl.
| | |
|---|---|
| *H01L 49/02* | (2006.01) |
| *H01L 29/06* | (2006.01) |
| *H01L 23/48* | (2006.01) |
| *H01L 29/66* | (2006.01) |
| *H01L 29/94* | (2006.01) |

(52) U.S. Cl.
CPC ............ *H01L 28/60* (2013.01); *H01L 23/481* (2013.01); *H01L 29/0623* (2013.01); *H01L 29/0642* (2013.01); *H01L 29/66181* (2013.01); *H01L 29/94* (2013.01); *H01L 29/0692* (2013.01); *H01L 2924/0002* (2013.01)

(58) Field of Classification Search
None
See application file for complete search history.

(56) References Cited

U.S. PATENT DOCUMENTS 5,726,084 A * 3/1998 Boyd ................ H01L 21/31053
257/E21.244
6,301,172 B1 10/2001 Derner et al.
(Continued)

FOREIGN PATENT DOCUMENTS

WO WO 2012/065229 5/2012

OTHER PUBLICATIONS

"CMOS Digital Isolators Supersede Optocouplers in Industrial Applications", Silicon Laboratories, Inc., 2010, pp. 1-18.
(Continued)

*Primary Examiner* — Michael Lebentritt
*Assistant Examiner* — Jordan Klein
(74) *Attorney, Agent, or Firm* — Sheridan Ross P.C.

(57) ABSTRACT

In one embodiment, an isolation device has a substrate, a metal plate, a conductive layer, first and second isolation layers are disclosed. The conductive layer may be formed within the substrate. The conductive layer may be arranged coupled to the metal plate, so as to receive a capacitively coupled signal from the metal plate. The first and second isolation layers may be sandwiched between the metal plate and the conductive layer. In another embodiment, an isolation device comprising a semiconductor substrate, a topmost metal layer and a plurality of additional metal layers is disclosed. The isolation device further comprises an isolation capacitor formed using the topmost metal layer and a conductive layer coupled to at least one of the plurality of additional metal layers.

20 Claims, 18 Drawing Sheets

(56) References Cited

U.S. PATENT DOCUMENTS

| | | |
|---|---|---|
| 6,630,699 B1 | 10/2003 | Wylie |
| 6,657,242 B1 | 12/2003 | Norstrom et al. |
| 6,657,262 B2 | 12/2003 | Patti |
| 6,855,985 B2 | 2/2005 | Williams et al. |
| 8,890,223 B1 * | 11/2014 | Bonifield ............ H01L 27/0288 |
| | | 257/296 |
| 9,087,853 B2 | 7/2015 | Tao et al. |
| 9,299,697 B2 * | 3/2016 | West ....................... H01L 28/91 |
| 2005/0017321 A1 * | 1/2005 | Hakkarainen ....... H01L 27/0805 |
| | | 257/532 |
| 2006/0102983 A1 * | 5/2006 | Iijima ............... H01L 21/02178 |
| | | 257/532 |
| 2010/0032773 A1 | 2/2010 | Shrivastava et al. |
| 2013/0001738 A1 * | 1/2013 | Dong ................ H01L 23/49575 |
| | | 257/508 |
| 2014/0145297 A1 * | 5/2014 | Daamen .................. H01L 28/40 |
| | | 257/507 |
| 2017/0098604 A1 * | 4/2017 | Ho ...................... H01L 23/5223 |

OTHER PUBLICATIONS

"Digital Isolator Design Guide", Texas Insturments Developer's Guide SLLA284, Jan. 2009, pp. 1-17.

Kugelstadt, Thomas, "New Digital Capacitive Isolators", Training Guide, ISO74xx & ISO75xx, Texas Instruments, Feb. 2010, pp. 1-17.

Official Action for U.S. Appl. No. 14/063,562, dated Jan. 26, 2015 5 pages.

Notice of Allowance for U.S. Appl. No. 14/063,562, dated Apr. 1, 2015 7 pages.

\* cited by examiner

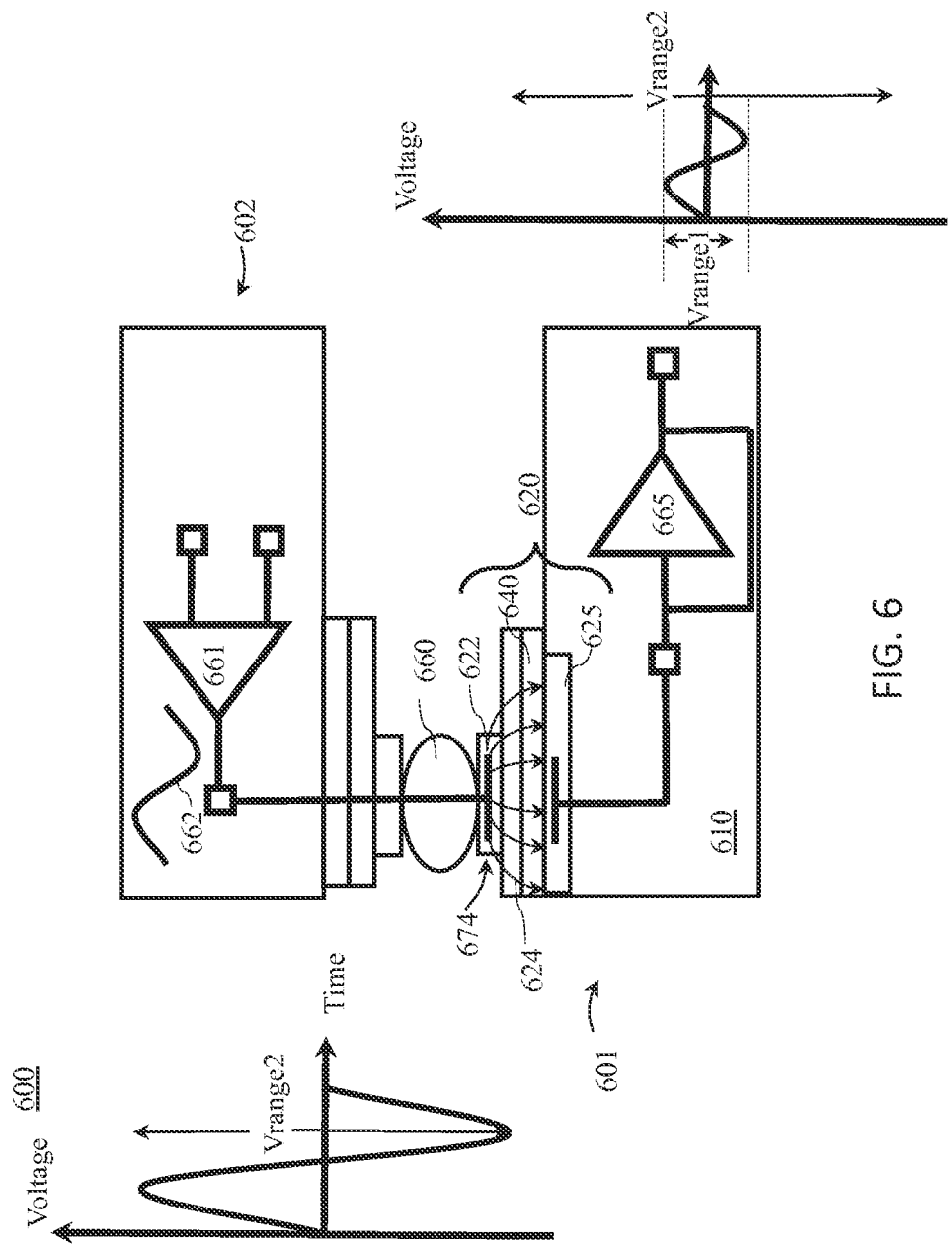

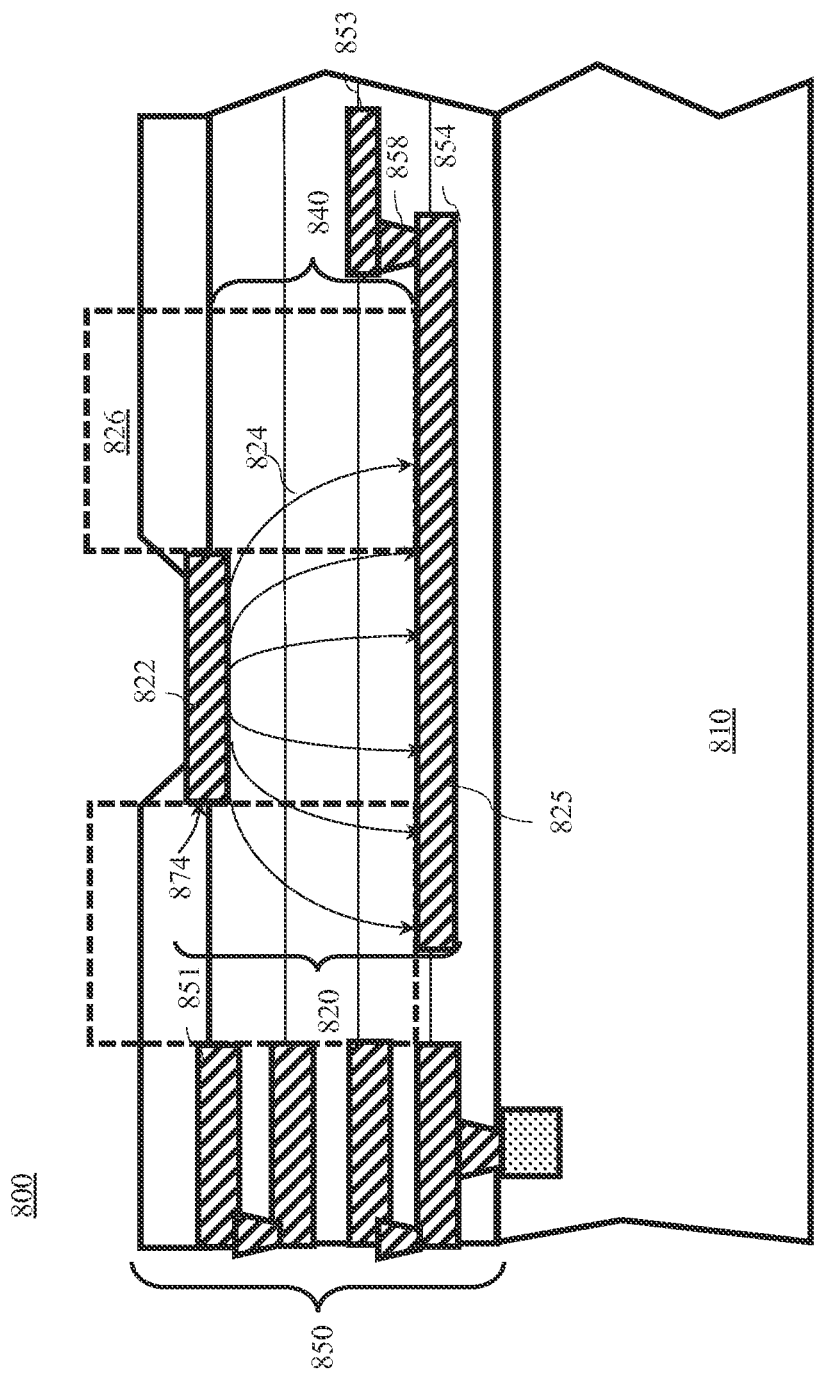

ISOLATION DEVICE

CROSS-REFERENCE TO RELATED APPLICATIONS

This application is a continuation of U.S. patent application Ser. No. 14/063,562, filed Oct. 25, 2013, the entire disclosure of which is hereby incorporated herein by reference.

BACKGROUND

A galvanic isolator provides a way for transmitting a signal from one electrical circuit to another electrical circuit in a control system when the two electrical circuits may otherwise be electrically isolated from one another. Usually the two electrical circuits operate at different voltages, and thus, may be electrically isolated. For example, consider an application in which a 5V battery powered controller board is configured to control a motor circuit operating at 240V. In this example, the 240V motor circuit may be electrically isolated from the 5V controller circuit, while permitting the 5V controller circuit to send or receive signals from the 240V motor circuit. In this type of application, an isolator may be used to provide voltage and/or noise isolation while still permitting signaling and/or information exchange between the two circuit systems.

Galvanic isolators may be further categorized into opto-isolators, capacitive isolators, magnetic isolators and radio frequency based isolators depending on the technology used to electrically isolate the electrical signal. An opto-isolator may comprise an optical emitter and an optical receiver. Over time, degradation may occur and optical signals emitted from the optical emitter may degrade.

Capacitive isolators may not have the optical degradation issue of the opto-isolators. However, incorporating high voltage capacitor into a semiconductor die may be technically challenging. Capacitors that are fabricated by using conventional semiconductor process may not meet the requirement of high voltage tolerance. For example, most capacitors in integrated circuit are metal oxide semiconductor (designated hereinafter as "MOS") capacitors or double layer poly-silicon capacitors. Sheet capacitance of MOS capacitors or double layer poly-silicon capacitors may be substantial. However, MOS capacitors may break down under high voltage. One reason may be that distance between the gate and the substrate may be lower than few microns. Overlapping metal layers in semiconductor dies would probably not be recognized as suitable for use in isolation applications because of the low and/or insubstantial capacitance value. In fact, most often, overlapping metal layers in semiconductor dies are considered as related to unwanted parasitic capacitance.

Most isolation capacitors in galvanic isolators may be formed through post processing steps after the semiconductor dies are fabricated. However, the postprocessing involves additional steps and may incur additional cost.

BRIEF DESCRIPTION OF THE DRAWINGS

Illustrative embodiments by way of examples, not by way of limitation, are illustrated in the drawings. The drawings may not be drawn per actual scale. Throughout the description and drawings, similar reference numbers may be used to identify similar elements.

FIG. 6 shows an illustrative view of an isolation system;

FIG. 8A illustrates a cut-away cross sectional view of an isolation device having an isolation capacitor with two metal plates;

DETAILED DESCRIPTION

Figure 1:
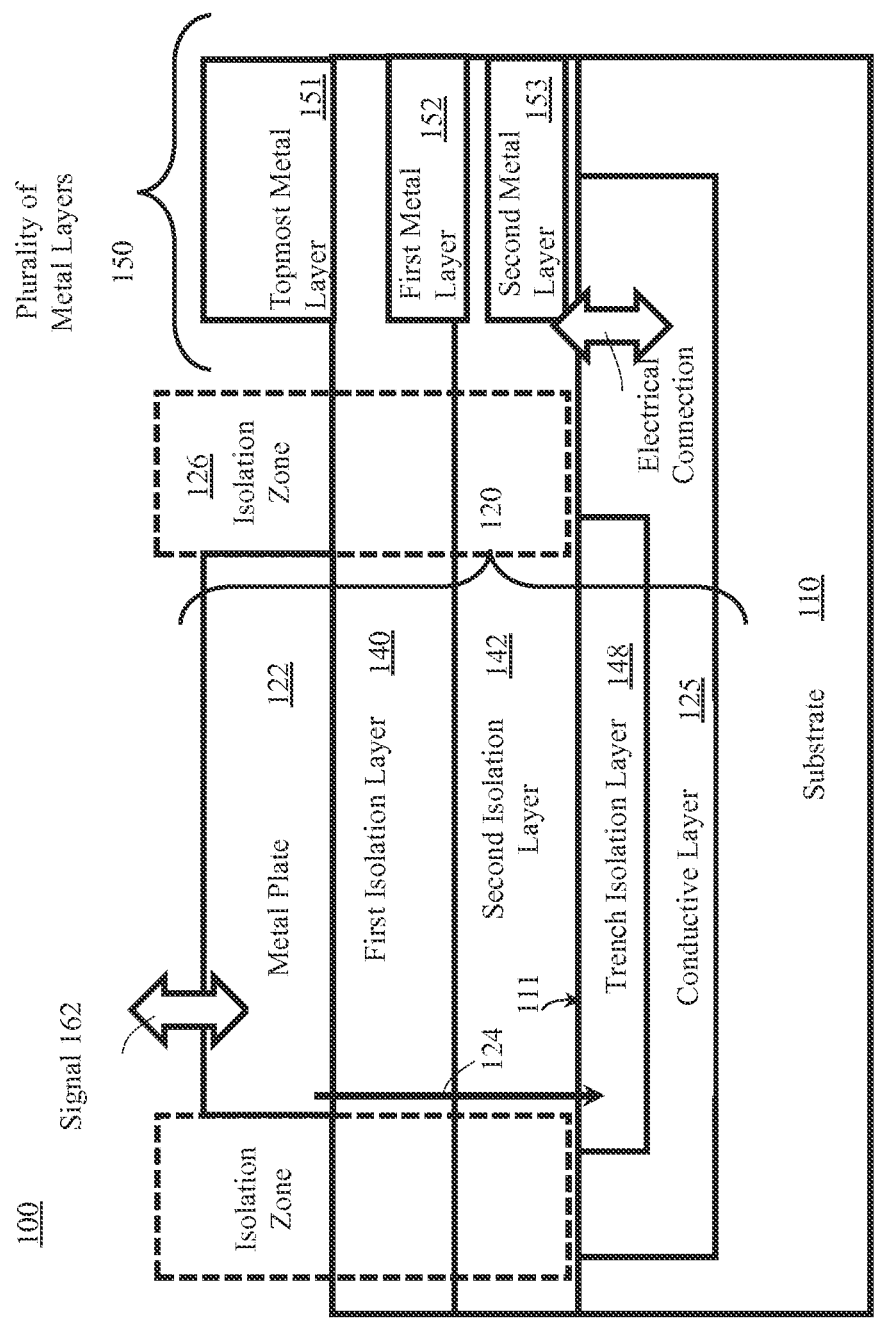
FIG. 1 shows an illustrative block diagram of an isolation device.

FIG. 1 shows an illustrative block diagram an isolation device 100. The isolation device 100 may be configured to electrically isolate one circuit from another circuit without the two circuits being electrically connected. Throughout this specification, "electrically isolate" may refer to isolating such that there is no direct electrical current. For example, a signal may be transmitted across from one circuit to another circuit (while still being electrically isolated) via electric field or electric flux generated within an isolation capacitor 120. However, direct current path for conveying an electrical signal may not exist. Throughout the specification, to isolate a structure may be understood as to electrically isolate the structure, so as to eliminate direct current to or from the structure.

The isolation device 100 may comprise a substrate 110, a plurality of metal layers 150, a first isolation layer 140 and a second isolation layer 142. The plurality of metal layers 150 may comprise a topmost metal layer 151, which may be formed furthest away from the substrate 110 among the plurality of metal layers 150, and a first metal layer 152 formed adjacent to the topmost metal layer 151, and a second metal layer 153 formed adjacent to the first metal layer 152 as illustrated in FIG. 1. The first metal layer 152 may be formed nearest to the topmost metal layer 151 such that the first isolation layer 140 may be sandwiched between the topmost metal layer 151 and the first metal layer 152.

Similarly, the second isolation layer 142 may be formed between the second metal layer 153 and the first metal layer 152.

The plurality of metal layers 150 may be metal layers, which may in some cases be configured to electrically interconnect electronic devices formed on the substrate 110, such as transistors, resistors, capacitors and other component formed on the substrate 110. Theoretically, one member of the plurality of metal layers 150 may be sufficient, and therefore in some embodiments the first and second metal layers 152-153 may be optional. However, in order to increase utility efficiency of the die, the isolation device 100 may usually comprise three or more layers of metal 151-153. For example, an isolation device 100 made using an approximately 90 nm dimension may comprise six metal layers. For isolation device 100 with three metal layers 151-153, the second isolation layer 142 may be sandwiched between the substrate 110 and the first metal layer 152.

The isolation device 100 may further comprise a metal plate 122 configured to receive a signal 162, and a conductive layer 125 formed within the substrate 110. As shown in FIG. 1, the first and second isolation layers 140, 142 may be sandwiched between the conductive layer 125 and the metal plate 122 such that the conductive layer 125 may be electrically isolated from the metal plate 122. The first isolation layer 140 may be formed adjacent to the metal plate 122. A first portion of the first isolation layer 140 may be sandwiched between the second isolation layer 142 and the metal plate 122, whereas a second portion of the first isolation layer 140 distanced from the metal plate 122 may be sandwiched between the topmost metal layer 151 and the first metal layer 152.

The first and second isolation layers 140, 142 may be sandwiched between the metal plate 122 and the conductive layer 125. The metal plate 122 and the conductive layer 125 may be arranged substantially in parallel. The first and second isolation layers 140, 142 may comprise substantially silicon dioxide material. As the topmost metal layer 151 may be exposed to high voltage, the first isolation layer 140 that is adjacent to the topmost metal layer 151 may be made more isolative relative to the second isolation layer 142. In one embodiment, the first isolation layer 140 may comprise polyimide material.

The metal plate 122 and the conductive layer 125 that are electrically isolated by the first and second isolation layers 140, 142 may form an isolation capacitor 120. The term "plate" may be used to describe a thin flat sheet of metal. The term plate in the context of the isolation capacitor 120 may refer to one part of an isolation capacitor 120 capable of emitting electric field for capacitively coupling a signal over to an opposing plate of an isolation capacitor 120. In the embodiment shown in FIG. 1, the metal plate 122 may be at least 10 um by 10 um and, a portion of the metal plate 122 may be substantially flat.

Similarly, the term "layer" may describe a sheet, quantity, or thickness of material. The term layer may refer to a portion of a substrate 110 with a different characteristic than a remainder of the substrate 110. For example, a portion of the substrate 110 may be highly doped to form an active region, which may be referred to as "layer". Similarly, a portion of the substrate 110 may be doped to form a well, which may be designated as "layer". The "active region layer" and the "well layer" may not be visibly identifiable or visibly differentiable from the substrate 110. However, the existence of the layer may be detected through electrical behavior. Similarly, the first and second isolation layer 140, 142 may be visibly seen as one integral part.

In the embodiment shown in FIG. 1, the metal plate 122 may form one part of an isolation capacitor 120 whereas the conductive layer 125 may form another part of an isolation capacitor 120. The metal plate 122 may be electrically isolated from the plurality of metal layers 150. The metal plate 122 may be solely electrically coupled externally and may not be electrically coupled to other electronic devices (not shown) formed on the substrate 110. On the contrary, the conductive layer 125 may be electrically coupled to other electronic devices formed on the substrate 110 through the plurality of metal layers 151-153. The metal plate 122 may be coupled to the signal 162 externally and may be configured to generate an electric flux 124, which may be indicative of the signal 162. The electric flux 124 may also be designated hereinafter as a capacitively coupled signal 124. Consequently, the conductive layer 125 may be coupled with the metal plate 122 to receive the capacitively coupled signal 124 from the metal plate 122. The conductive layer 125 may be relative larger than the metal plate 122 so as to substantially capture the electrical flux 124 from the metal plate 122.

The capacitively coupled signal 124 may be an output signal 124. In other words, arrangement may be configured so that the capacitively coupled signal 124 may be transmitted from the conductive layer 125 to the metal plate 122. Alternatively or additionally, the capacitively coupled signal 124 may be an input signal 124. In such case, arrangement may be configured so that the capacitively coupled signal 124 may be transmitted from the metal plate 122 to the conductive layer 125. Further, arrangement may be configured so that one or more capacitively coupled signals 124 may be bi-directional signals 124 transmitted between the metal plate 122 and the conductive layer 125.

In order to improve tolerance towards high voltages, the metal plate 122 may be formed from the topmost metal layer 151 whereas the conductive layer 125 may be formed from a portion of the substrate 110. For example, the conductive layer 125 may be an n-well, a p-well, n-active region or p-active region embedded within the substrate 110. In order to create further distance between the metal plate 122 and the conductive layer 125, a trench isolation layer 148 may be formed between the metal plate 122 and conductive layer 125. The trench isolation layer 148 may be formed adjacent to a surface 111 of the substrate 110. As shown in FIG. 1, the trench isolation layer 148 may be sandwiched between the conductive layer 125 and the second isolation layer 142. For semiconductor a process having more than two metal layers 151-152, there may be additional isolation layers (not shown) sandwiched between the trench isolation layer 148 and the second isolation layer 142. In another embodiment, the trench isolation layer 148 may be in direct contact with the second isolation layer 142.

As illustrated by FIG. 1, a substantial portion of the conductive layer 125 may be buried within the substrate 110. However, a portion of the conductive layer 125 positioned further away from the metal plate 122 may be formed near the surface 111 of the substrate 110 in order to establish electrical connection with the plurality of metal layers 150. The electrical connection may be established through a "via" connecting the buried metal layer of the plurality of metal layers 150 that is closest to the substrate 110. The trench isolation layer 148 may be approximating the metal plate 122 and may be made of at least similar size or larger than the metal plate 122. This arrangement may ensure higher capacitance and may prevent breakdown of the isolation capacitor 120 due to high voltage.

The isolation device 100 may be configured to electrically isolate high voltages. Unlike a practice of having unity metal structure surrounding the metal plate 122, the isolation device 100 may further comprise an isolation zone 126 that may be devoid and/or substantially devoid of the plurality of metal layers 150 surrounding the metal plate 122. The isolation zone 126 may extend substantially perpendicularly relative to the metal plate 122. A portion of the isolation zone 126 may be adjacent to one side of the conductive layer 125. As shown in FIG. 1, one side of the conductive layer 125 may be in direct contact with the isolation zone 126, which may comprise substantially insulating material such as silicon dioxide, and which may form the first and second isolation layers 140, 142. A portion of the conductive layer 125 may extend outwardly beyond the isolation zone 126 so that one of the plurality of metal layers 150 may establish an electrical connection to the conductive layer 125.

Figure 2A:
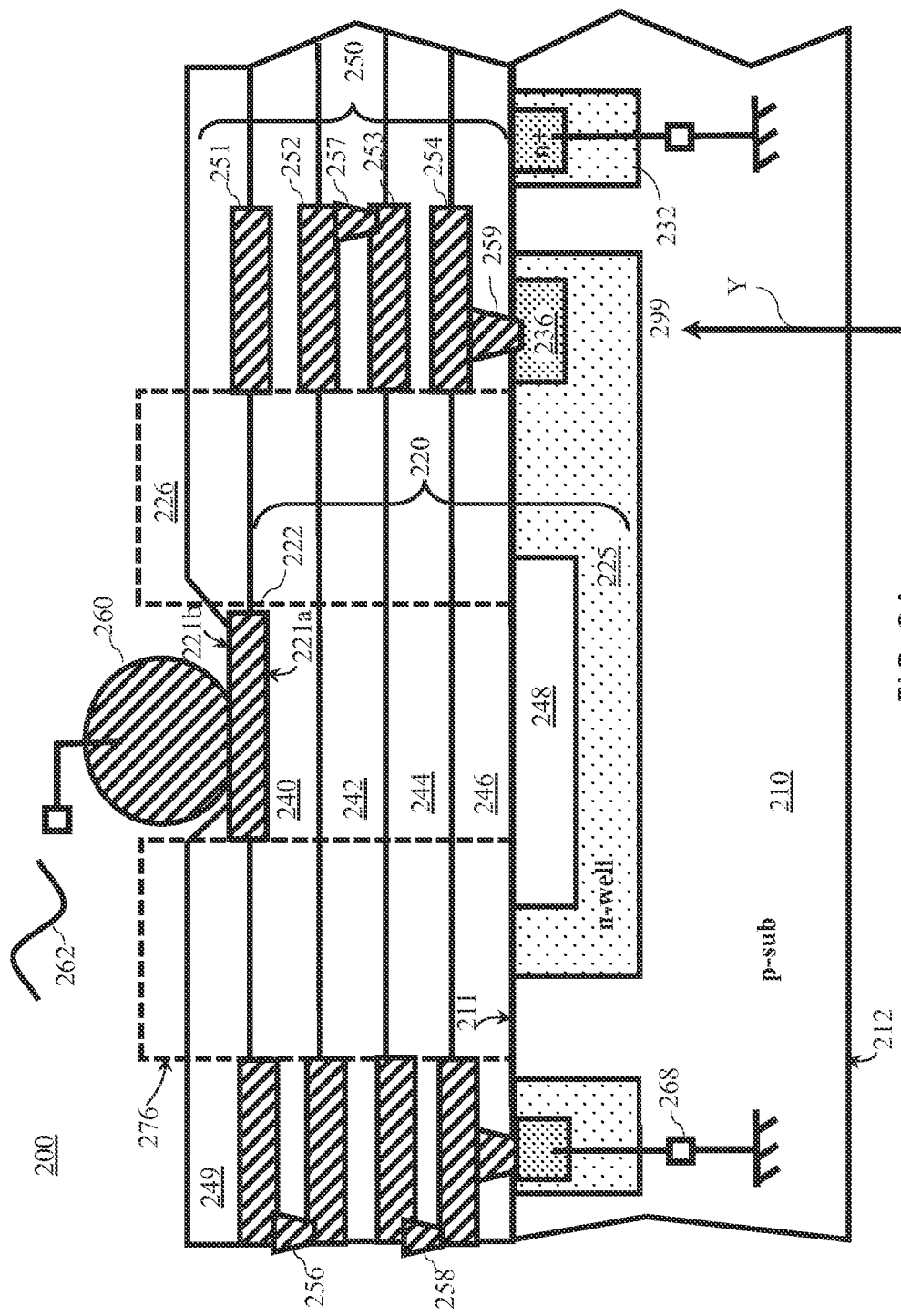
FIG. 2A illustrates an illustrative cross sectional view of an isolation device.
Figure 2B:
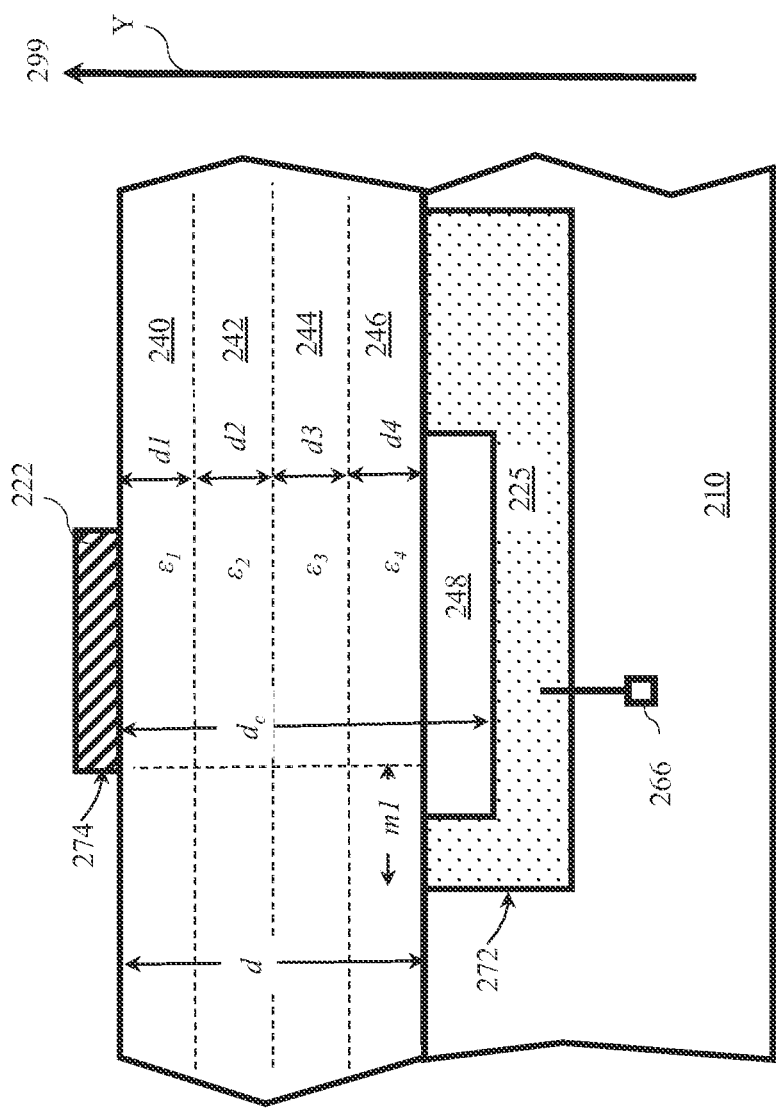
FIG. 2B illustrates a cut-away cross sectional view of the isolation device shown in FIG. 2A.
Figure 2C:
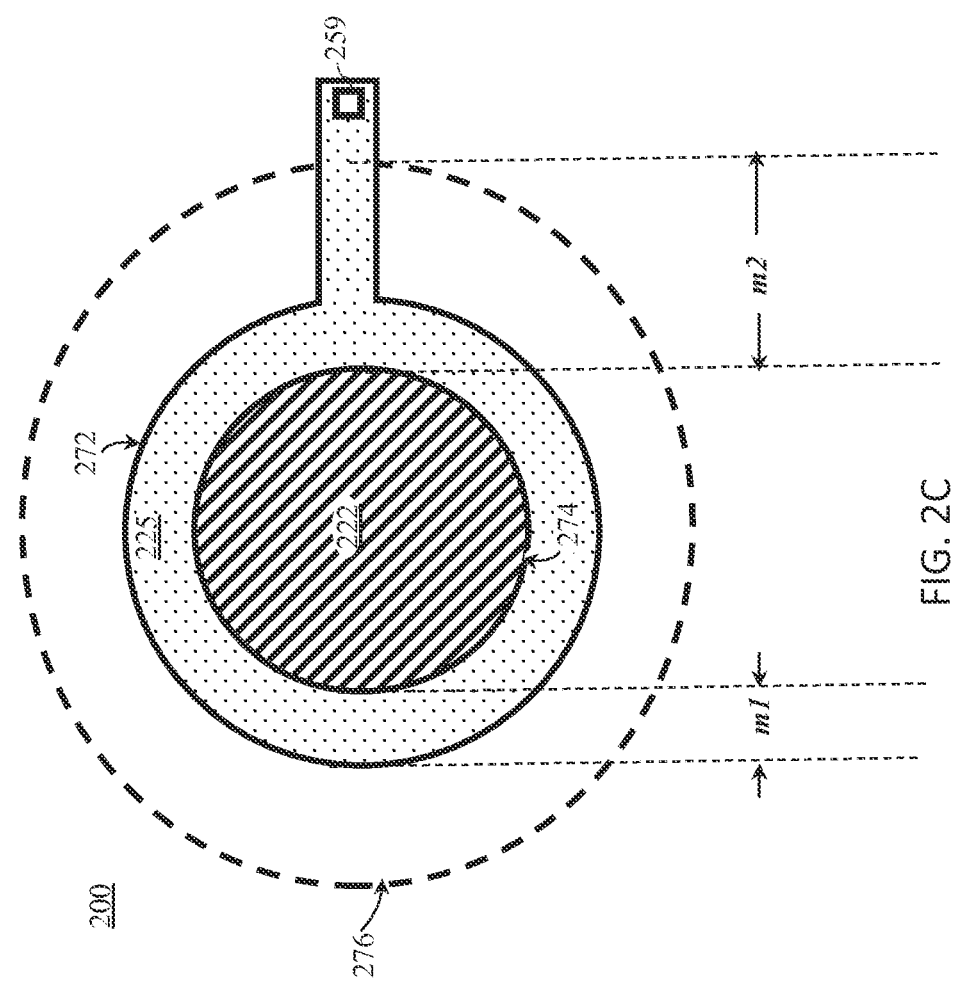
FIG. 2C illustrates a top view of the isolation device shown in FIG. 2A.

FIG. 2A illustrates an illustrative cross sectional view of an isolation device 200. The isolation device 200 may comprise a semiconductor substrate 210, a plurality of isolation layers 240-246, a topmost metal layer 251, and a plurality of additional metal layers 252-254. FIG. 2B illustrates a cut-away cross sectional view of the isolation device 200 shown in FIG. 2A providing more information about the isolation layers 240-246. FIG. 2C illustrates a top view of the isolation device shown in FIG. 2A. Referring to FIGS. 2A-2C, the topmost metal layer 251 may be formed adjacent to a component surface 211 of the semiconductor substrate 210. The plurality of additional metal layers 252-254 may be sandwiched between the topmost metal layer 251 and the semiconductor substrate 210. All of the metal layers 251-254 in combination, including the topmost metal layer 251, and the additional metal layers 252-254 may be designated hereinafter as "a plurality of metal layers 250".

Each of the plurality of metal layers 250 may be isolated from one another by the plurality of isolation layers 240-246. There are four metal layers 250 and four isolation layers 240-246 shown in the embodiment in FIG. 2A, but in another embodiment, the number may be more or may be less. The plurality of metal layers 250 may comprise the topmost metal layer 251 that may be formed furthest away from the semiconductor substrate 210 measured in a direction 299 perpendicular to the semiconductor substrate 210. The topmost metal layer 251 may form a bond pad for electrical coupling with external device. For example, the topmost metal layer 251 may comprise a redistribution metal layer for flip-chip packaging technology. As shown in FIG. 2A, a bond ball or a solder bump 260 may be formed on the topmost metal layer 251.

A first metal layer 252 may be formed adjacent to the topmost metal layer 251. The first metal layer 252 and the topmost metal layer 251 may be isolated by a first isolation layer 240, which may be sandwiched between the first metal layer 252 and the topmost metal layer 251. The first metal layer 252 may be second furthest away from the semiconductor substrate 210 measured in the direction 299 perpendicular to the semiconductor substrate 210. A second metal layer 253 may be formed adjacent to the first metal layer 252. The second metal layer 253 and the first metal layer 252 may be isolated by a second isolation layer 242, which may be sandwiched between the first metal layer 252 and the second metal layer 253. The second metal layer 253 may be third furthest away from the semiconductor substrate 210 measured in the direction 299 perpendicular to the semiconductor substrate 210. A third metal layer 254 may be formed adjacent to the second metal layer 253. The third metal layer 254 may be arranged between two metal layers 250, where there may be more than four metal layers 250. In the embodiment shown in FIG. 2A using a four metal layer process, the third metal layer 254 may be relatively closest to the semiconductor substrate 210 measured in the direction 299 perpendicular to the semiconductor substrate 210. The third metal layer 254 in the embodiment shown in FIGS. 2A-2C may also be designated as the first deepest buried metal layer 254. A third isolation layer 244 may be interposed between the third metal layer 254 and the second metal layer 253. The third isolation layer 244 may be configured to provide electrical isolation. Similarly, a fourth isolation layer 246 may be interposed, and may be configured to provide electrical isolation, between the third metal layer 254 and the semiconductor substrate 210. If electrical connection is needed, "via"s 256-259 may be employed. An active region 236 may be formed together with a "via" 259 so as to establish electrical connection with the semiconductor substrate 210.

During fabrication process of an integrated circuit such as the isolation device 200, the first deepest buried metal layer 254 (i.e. the third metal layer 254) may be formed first, followed by the second deepest buried metal layer 253 (i.e. second metal layer 253). For this reason, in the embodiment shown in FIG. 2A, the third metal layer 254 being the first deepest buried metal layer 254 may be referred to as "M1", whereas the second metal layer 253 being the second deepest buried metal layer 254 may be referred to as "M2". Similarly, the first metal layer 252 being the third deepest buried metal layer 254 may be designated as "M3", and topmost metal layer 251 may be designated as "M4". For protection purposes, the entire semiconductor substrate 210, except a portion of the topmost metal layer 251, may be covered by a passivation layer 249. As shown in FIG. 2A, the first capacitive plate 222 may comprises an internal surface 221a, adjacent to the first isolation layer 240, and an external surface 221b, which may be configured to receive at least a solder bump or a wire bond. In some embodiments the external surface 221b may not be covered by the passivation layer 249.

A portion of the semiconductor substrate 210 may be made substantially more conductive relative to the semiconductor substrate 210 to form a conductive layer 225. The conductive layer 225 may be formed using a well region or an active region that may be a portion of the semiconductor substrate 210, and that may be made more conductive. For example, a portion of the semiconductor substrate 210 may be made more conductive by implanting carriers into the portion of semiconductor, so as to form a well or an active region. In some instances, a portion of the semiconductor substrate 210 may be deposited with a poly-silicon structure, which may be made more conductive. The poly-silicon structure may be used to form gate oxide or a double poly capacitor in a CMOS integrated circuit fabrication process. In the embodiment shown in FIG. 2A, the conductive layer 225 may be a non-metal structure, which may be made more conductive compared to the semiconductor substrate 210. An example of approximate conductivity of each layer is illustrated in Table 1.

TABLE 1

An example of Resistance Value

| Layer Name | Resistance |
| --- | --- |
| Topmost Layer (RDL) | ~0.08 ohm/sq |
| M1-M5 | ~0.08 ohm/sq |

TABLE 1-continued

An example of Resistance Value

| Layer Name | Resistance |
| --- | --- |
| Isolation between metals | 2-4 G ohm/sq |
| Poly-silicon | ~5 ohm/sq |
| N-well | ~1K ohm/sq |
| N+ | ~5 ohm/sq |
| P+ | ~5 ohm/sq |
| Trench Isolation Layer | 2-4 G ohm/sq |
| P-substrate | 10-40K ohm/sq |

The conductive layer 225 may be configured to have different carriers as the semiconductor substrate 210, especially when the conductive layer 225 is in direct contact with the semiconductor substrate 210. For example, if the semiconductor substrate 210 is a p-substrate, the conductive layer 225 may be an n-well or an n+ (n-active region). Contrary, if the semiconductor substrate 210 is an n-substrate, the conductive layer 225 may be a p-well or a p+(p-active region). The above may not be applicable for occasions when the conductive layer 225 is isolated from the semiconductor substrate 210 by additional layer. For example, the conductive layer 225 may be a p-well surrounded by an n-well in a p-substrate. As shown in the example in Table 1, the conductive layer 225 may be n+, p+, poly-silicon or n-well, which may be substantially less conductive compared to metal layers 250, but may be relatively more conductive than the semiconductor substrate 210. A protective ring 232 may be formed surrounding the conductive layer 225, so as to prevent noise and/or coupling to another portion of the semiconductor substrate 210. The protective ring 232 may be a well formed deeper into the semiconductor substrate 210 relative to the conductive layer 225. The protective ring 232 may be coupled to a ground terminal 268.

The isolation device 200 may further comprise an isolation capacitor 220. The isolation capacitor 220 may comprise a first capacitive plate 222 and a second capacitive plate 225. The first capacitive plate 222 may be coupled to the topmost metal layer 251, whereas the second capacitive plate 225 may be the conductive layer 225. In the embodiment shown in FIG. 2A, the first capacitive plate 222 may comprise a substantial portion of the topmost metal layer 251. The second capacitive plate 225 may comprise the conductive layer 225, which may be a non-metal. As appreciated by a person skilled in the art, the structures formed within an integrated circuit may not be completely flat, because circumference of such structures may be irregular. In addition, the conductive layer 225 may be embedded within the semiconductor substrate 210 with a trench isolation layer 248, which may be formed adjacent to the conductive layer 225. The trench isolation layer 248 may be a substantially similar size as the first conductive plate 222. Hence, the second capacitive plate 225, being the conductive layer 225 of an n-well that surrounds the trench isolation layer 248, may be relatively larger than the first capacitive plate 222. In another embodiment, the trench isolation layer 248 may be larger than the first capacitive plate 222, but may be smaller than the second capacitive plate 225 or the conductive layer 225.

As shown in FIG. 2A and FIG. 2B, the first and second capacitive plates 222, 225 may be separated by of the first, second, third and fourth isolation layers 240-246. Each of the first, second, third and fourth isolation layers 240-246 may have a thickness of $d_1$, $d_2$, $d_3$ and $d_4$ respectively. The topmost metal layer 251 may be formed at a predetermined distance d from the semiconductor substrate 210, which may be approximately the sum of the thicknesses $d_1$-$d_4$ of the plurality of isolation layers 240-246. For an isolation capacitor 220 with n layers of isolation layers 240-246, the distance d between the first and second capacitive plate 222, 225 may be expressed approximately by the following formula:

$$d = d_1 + d_2 + \ldots + d_n = \sum_1^n d_i$$

As shown in FIG. 2B, by having the trench isolation layer 248, the conductive layer 225 may be formed even further away from the first capacitive plate 222. Without the trench isolation layer 248, the distance between the first and second capacitive plates 222, 225 may be approximately d. However, with the trench isolation layer 248, the distance may be that may be $d_c$ relatively larger than the distance d. The trench isolation layer 248 may be a shallow trench isolation layer or a deep trench isolation layer.

Each of the first, second, third and fourth isolation layers 240-246 may have a permittivity of $\varepsilon_1$, $\varepsilon_2$, $\varepsilon_3$ and $\varepsilon_4$ respectively. In some process, the permittivity $\varepsilon_1$-$\varepsilon_4$ may be substantially similar but on many occasions, the permittivity $\varepsilon_1$-$\varepsilon_4$ may be relatively different. For example, in the embodiment shown in FIG. 2A and FIG. 2B, the first permittivity $\varepsilon_1$ may be substantially larger than the second permittivity $\varepsilon_2$. This may be achieved by adding substantive isolation materials into each of the plurality of isolation layers 240-246. For example, the first isolation layer 240 may comprise polyimide material in addition to the silicon dioxide material. For an isolation capacitor 220 with n layers of isolation layers 240-246, permittivity for each layer may be represented as approximately $\varepsilon_1$, $\varepsilon_2$, $\varepsilon_3$ . . . $\varepsilon_n$. The isolation capacitor 220 may be treated as n capacitors connected in serial with thickness of $d_i$. Since the total potential differences between the two electrodes may be approximately the sum of potential difference across each individual capacitor, approximately expressed as:

$$\Delta V = \Delta V_1 + \Delta V_2 + \ldots + \Delta V_n = \sum_1^n \Delta V_i$$

Each individual capacitor may have approximately the same amount of charge as that of total capacitor C, which is set to be Q. Thus may be approximately expressed as:

$$C_i = \frac{Q}{\Delta V_i} = k_i \frac{\varepsilon_0 A}{d_i}$$

In the above equation, $\varepsilon_0$ may be a physical constant commonly called the vacuum permittivity or permittivity of free space, $k_i$ may be relative permittivity that is also referred to as dielectric constant, whereas A may be the total overlapping areas between the two electrodes of the isolation capacitor 220. In some embodiments the value $\varepsilon_0$ may be approximately 8.854 187 817 . . . ×10−12 farads per meter (F·m−1). Thus total capacitance of the capacitor may be approximately calculated as:

$$C = \frac{Q}{\Delta V} = \frac{Q}{\Delta V_1 + \Delta V_2 + \ldots + \Delta V_n} = \frac{Q}{\frac{Q}{C_1} + \frac{Q}{C_2} + \ldots + \frac{Q}{C_n}}$$

By substituting the equations for each individual capacitor and simplifying the equation, the capacitance of the isolation capacitor 220 may be expressed approximately as:

$$C = \frac{\epsilon_0 A}{\frac{d_1}{k_1} + \frac{d_2}{k_2} + \ldots + \frac{d_n}{k_n}} \qquad \text{Equation (1)}$$

In the above formula, $d_i$ may be the approximate thickness of each individual layer of isolation layers 240-246, whereas $k_i$ may be approximate relative permittivity of each individual layer with integer i range from 1 to n. Capacitance of the isolation capacitor 220 may be increased by either increasing the surface area A of the first and second capacitive plate 222, 225, reducing the gap or distance d between the first and second capacitive plate 222, 225, or selecting a permittivity k that may be huge. The Equation (1) explained above may be rough first order estimation meant for illustration purpose. Actual values may differ. In order to obtain highest capacitance, typically the first and second capacitive plate 222, 225 may be formed close to each other. However, the isolation device 200 and the isolation capacitor 220 may be configured to isolate circuits having extremely high voltages. Depending on the material used to form the isolation capacitor 220, the isolation capacitor 220 may have a limit as to the maximum energy the isolation capacitor 220 can store physically. When a specific electric field related to dielectric strength $E_{ds}$ is exceeded, the isolation capacitor 220 may breakdown. The breakdown voltage of a capacitor, $V_{bd}$ may be estimated using the following formula, where d is approximately the distance between the first and second capacitive plate 222, 225.

$$V_{bd} = E_{ds} d \qquad \text{Equation (2)}$$

Similar to Equation (1), Equation (2) shown above may be rough estimation for illustration purpose. The dielectric strength $E_d$ may be determined by the material used to form the isolation layers 240-246. In order to withstand higher voltage, the dielectric strength $E_{ds}$ may be chosen to as high as possible. For example, polyimide material may have high dielectric strength $E_{ds}$ and thus, may make a good material candidate for the isolation layers 240-246, especially the first isolation layer 240. The first isolation layer 240 may be formed adjacent to the first capacitive plate 222 configured to receive high voltage. Another way to withstand higher voltage may be by selecting the conductive layer 225 of the second conductive plate 225 to be as further away, as much as possible. For example, the furthest distance $d_c$ may be obtained by selecting the topmost metal layer 251 to form the first capacitive plate 222 and the conductive layer 225, with a trench isolation layer 248 to form the second capacitive plate 225. This may vary from Equation (1) discussed previously, with respect to capacitance value. Therefore, there may be a trade-off in selecting the formation of the isolation capacitor 220.

An isolation capacitor 220 with the furthest distance d may have smallest capacitance value. For isolation devices 200 that may be used in high voltage environment, having a high breakdown voltage may be one of the important considerations. The distance d between the first and second capacitive plates 222, 225 may be selected to be highest possible. The reduction in capacitance value may be overcome by increasing the capacitor size, and/or adjusting other parameters in the circuit coupled to the isolation capacitor 220. Any negative impact on efficiency in design of the isolation device 200 may be mitigated because the first capacitive plate 222 may have a second use of being a bond pad.

As explained previously in FIG. 2A, the first capacitive plate 222 of the isolation capacitor 220 may be electrically coupled to an external terminal for receiving a signal 262. The signal 262 may be a bi-directional signal. The signal 262 may have a substantially different voltage from the isolation device 200. For this reason, the isolation device 200 may have an isolation zone 226 surrounding the first capacitive plate 222 of the isolation capacitor 220. The isolation zone 226 may have a zone perimeter 276. However, a portion of the isolation zone 226 may be adjacent to, and may be in direct contact with, the second capacitive plate 225. In addition, the conductive layer 225 of the second capacitive plate 225 may be electrically connected to other portions of the isolation device 200. At least for this purpose, a portion of the conductive layer 225 may be extended beyond the zone perimeter 276 of the isolation zone 226 and be electrically coupled to at least one of the plurality of additional metal layers 253-254 through the "via" 259 outside the isolation zone 226. As shown in FIG. 2A, the conductive layer 225 may be electrically adjoined to the third metal layer 254 through the "via" 259. The metal layer 254 may be a first deepest buried metal layer of the plurality of additional metal layers 251-254 positioned closest relative to the semiconductor substrate 210.

Referring to FIG. 2A and FIG. 2C, the first and second capacitive plate 222, 225 may be substantially circular or elliptical shape, so as to substantially avoid having a high density of electric field. Similarly, the zone perimeter 276 of the isolation zone 226 may be substantially circular shape. Some design rules in making the mask used in fabrication may not allow circular shape. In order to overcome this, the first and second capacitive plates 222, 225 may be designed in a heptagonal shape or other polygonal shape, which may be substantially circular, and may substantially avoid sharp edges. Referring to FIG. 2B and FIG. 2C, the first capacitive plate 222 may have a plate perimeter 274. Similarly the second capacitive plate 225 or the conductive layer 225 may have layer perimeter 272. As shown in FIG. 2C, the layer perimeter 272 may extend outwardly from the plate perimeter 274. Similarly, the zone perimeter 276 may extend outwardly from the layer perimeter 272. The zone perimeter 276, the layer perimeter 272 and the plate perimeter 274 may be coaxially aligned. As shown in FIG. 2C, the layer perimeter 272 may be extending by a distance of "m1" from the plate perimeter 274 whereas the zone perimeter 276 may extend by a distance of "m2" from the plate perimeter 274.

Figure 2D:
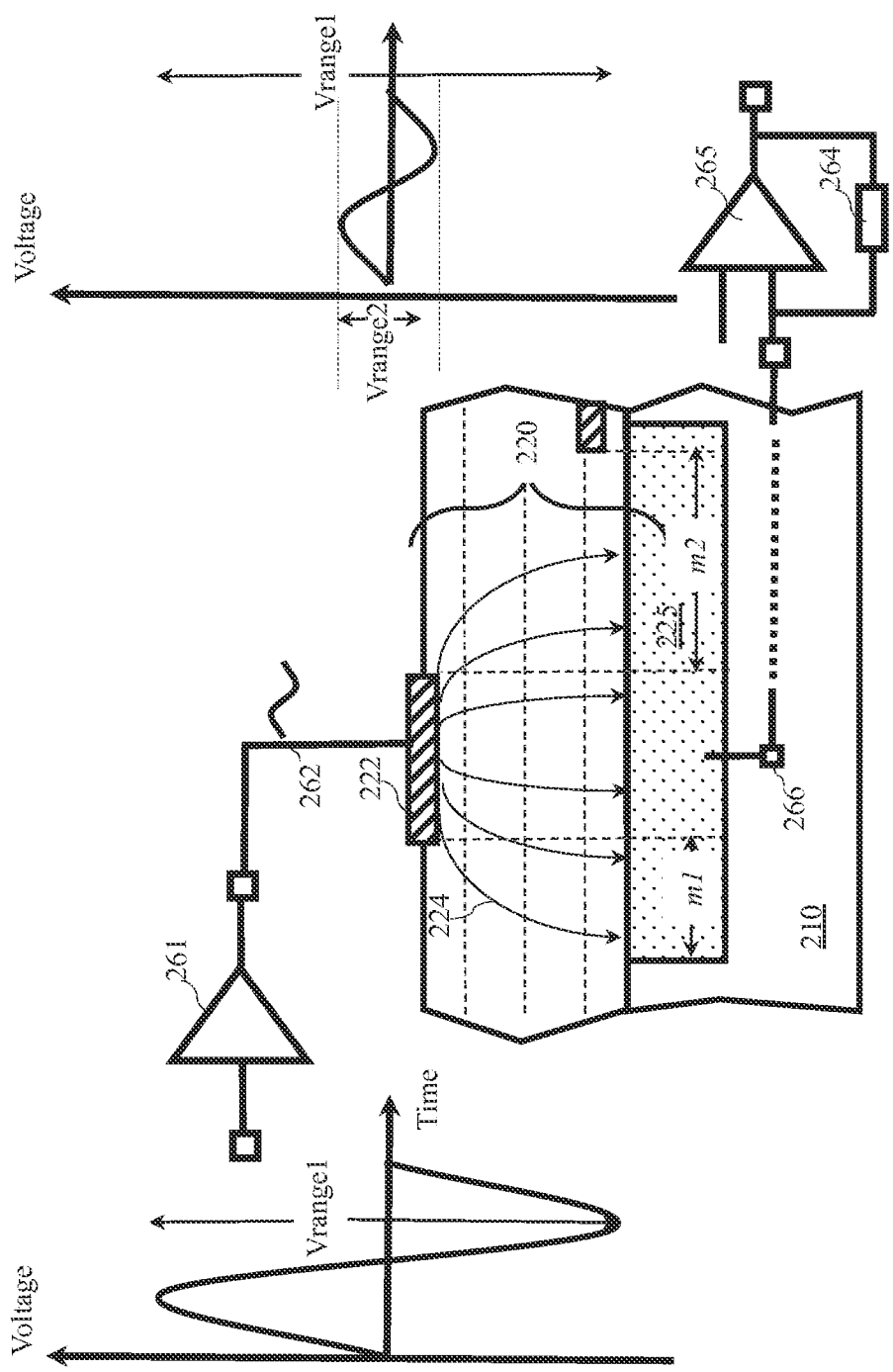
FIG. 2D shows an illustrative view of the isolation device shown in FIG. 2A particularly showing transmission of an input signal across the isolation device.

FIG. 2D illustrates an illustrative view of the isolation device 200 shown in FIG. 2A showing transmission of the signal 262 being transmitted across the isolation device 200. Referring to FIG. 2A and FIG. 2D, an electric field having an electric flux 224 may be generated in accordance to the signal 262. The second capacitive plate 225 may be configured to receive the electric flux 224, which may be designated hereinafter as capacitively coupled signal 224. In other words, the second capacitive plate 225 may be coupled with the first capacitive plate 222, so as to receive the capacitively coupled signal 224, which may be indicative of the signal 262. Without the plurality of metal layers 250 positioned within the isolation zone 226, a substantial amount of the electric flux 224 generated may be captured by the second capacitive layer 225. If one of the plurality of metal layers 250 is present within the isolation zone 226, the electric flux 224 may be directed towards one of the plurality of metal layers 250, instead of towards the second capacitive plate 225. As the plurality of metal layers 250 may be a structure with pointed end, electric field may be concentrated towards the pointed end, which may cause the isolation capacitor 220 to breakdown.

The strength of the electric flux 224 may vary in accordance to the signal 262. The second capacitive plate 225 may be formed large enough so as to capture the electric flux 224 generated from the plate perimeter 274 of the first capacitive plate 222. Referring to FIG. 2C and FIG. 2D, the distance of "m1" may be a margin to ensure that the second capacitive plate 225 may capture a substantial portion of the electric flux 224 generated from the plate perimeter 274 of the first capacitive plate 222. The distance of "m2" may be a margin so as to prevent a breakdown of the isolation capacitor 220.

The first capacitive plate 222 may be coupled to an external circuit 261. The voltage range of the external circuit 261 may be a first voltage range, $V_{range1}$ as shown in the graph on the left. The second capacitive plate 225 may be coupled to an internal circuit 265 of the isolation device 200 through an internal node 266. The internal circuit 265 may be formed using transistors (not shown) formed on the semiconductor substrate 210 adjacent to the isolation capacitor 220. The voltage range of the internal circuit 265 may be a second voltage range $V_{range2}$ as shown in the graph on the right.

As shown in FIG. 2D, the second voltage range $V_{range2}$ may be substantially different from the first voltage range $V_{range1}$. In the example shown in FIG. 2D, the second voltage range $V_{range2}$ may be approximately between −5V and +5V, whereas the first voltage range $V_{range1}$ may be approximately between −100V and +100V. In another example, the second voltage range $V_{range2}$ may be approximately between 0V and +5V, whereas the first voltage range $V_{range1}$ may be approximately between 0V and +95V. The absolute voltage value of the external circuit 261 may be higher or lower than the absolute voltage value of the internal circuit 265. However, the absolute voltage of the internal terminal 266 coupled to the second capacitive plate 225 may be biased accordingly, for example, using an additional internal circuit 264, such that there is approximately no forward bias or approximately no direct current path between the semiconductor substrate 210 and the conductive layer 225. Consider an example where the conductive layer 225 may be formed using an n-well, and the semiconductor substrate 210 may be formed using a p-type semiconductor substrate 210. The p-n junction between the n-well and the p-type substrate may be biased such that the absolute voltage of the n-well is always higher than the absolute voltage of the p-type semiconductor substrate 210. In the embodiment shown in FIG. 2D, the internal circuit 265 may be an amplifier circuit, and the additional internal circuit 264 may be an internal resistor or a capacitor. The additional internal circuit 264 may provide a feedback to the terminal 266 as inputs to the internal circuit 265. This feedback configuration may provide a biasing voltage to the internal terminal 266 so that the voltage of the conductive layer 225 may be maintained higher than the semiconductor substrate 210.

Figure 2E:
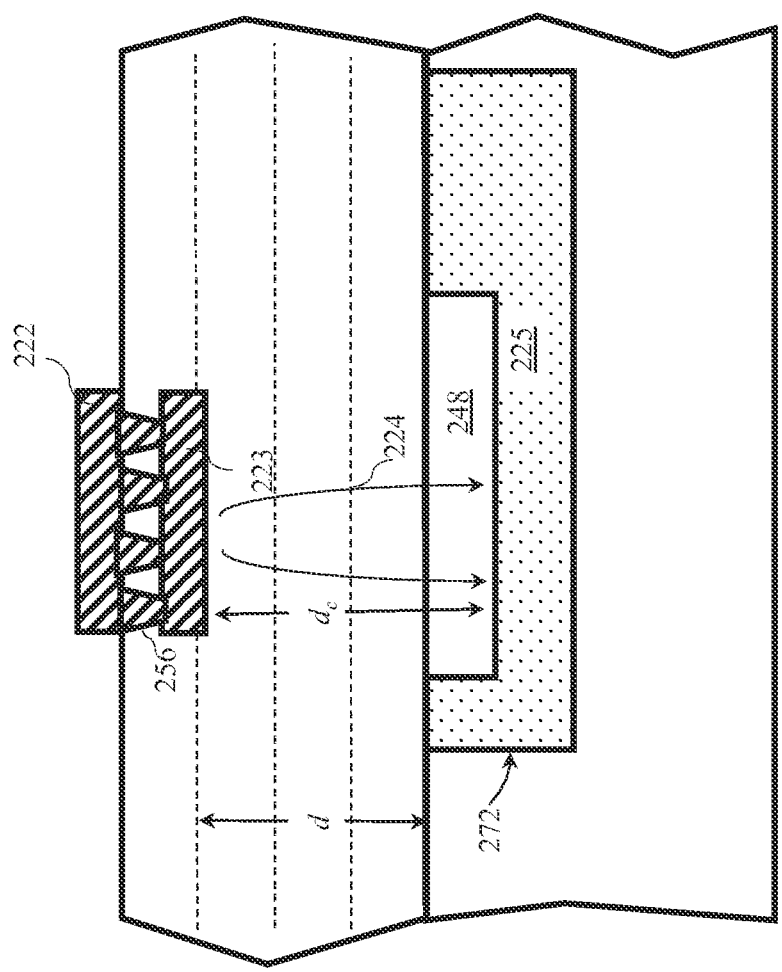
FIG. 2E illustrates an alternative arrangement of the isolation device to increase capacitance.

FIG. 2E shows an alternative arrangement to increase capacitance value of the isolation capacitor 220 shown in FIG. 2A by having an additional metal plate 223. Referring to FIG. 2D and FIG. 2E, the second capacitive plate 225 may be coupled with the first capacitive plate 222 to receive the capacitively coupled signal 224 that is indicative of the signal 262. However, differing from FIG. 2D, the electric flux or the capacitively coupled signal 224 may not be generated directly from the first capacitive plate 222 but generated indirectly through the additional metal plate 223. The additional metal plate 223 may be formed using the first metal layer 251 shown in FIG. 2A. The additional metal plate 223 may be electrically connected to the first capacitive plate 222 by using a plurality of "vias" 256. Comparing FIG. 2E and FIG. 2B, the distance d has been reduced and thus, capacitance value may be increased as approximately described in Equation (1). However, the alternative arrangement shown in FIG. 2E may have less tolerance towards high voltage value as discussed previously.

Figure 3A:
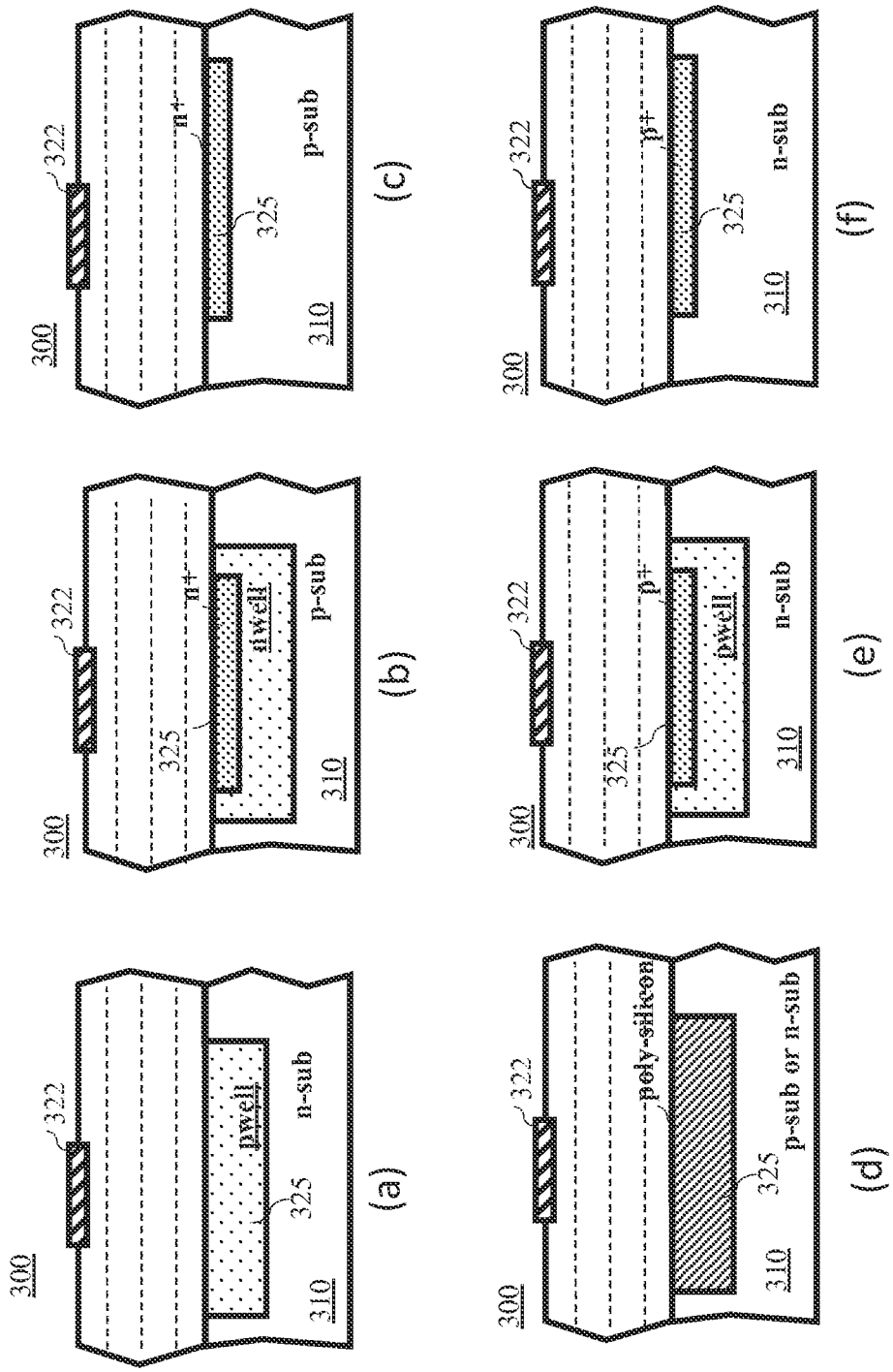
FIG. 3A illustrates first implementation examples of the isolation device using a well or substrate.

FIG. 3A illustrates first implementation examples of the isolation device 200 using well or substrate. FIG. 3A (a) shows an isolation device 300 formed using a metal layer 322 and a p-well 325 to form a capacitor. The semiconductor substrate 310 may be an n-type substrate. FIG. 3A (b) shows isolation device 300 formed using a metal layer 322 and an n-type active region 325 to form a capacitor 320. The semiconductor substrate 310 may be a p-type substrate. The n-type active region may be surrounded by an n-well. FIG. 3A(c) may be similar to FIG. 3A (b) having a p-type substrate 310 but without having the n-well. FIG. 3A (d) shows an isolation device 300 formed using a metal layer 322 and a poly-silicon layer 325 to form a capacitor 320. The semiconductor substrate 310 may be an n-type or a p-type substrate. The poly-silicon layer 325 may be an embedded poly-silicon layer 325 formed within the semiconductor substrate 310. FIG. 3A (e) shows an isolation device 300 formed using a metal layer 322 and a p-type active region 325 to form a capacitor 320. The semiconductor substrate 310 may be an n-type substrate. The p-type active region may be surrounded by a p-well. FIG. 3A (0 may be similar to FIG. 3A (e) but without having the p-well on the semiconductor substrate 310.

Figure 3B:
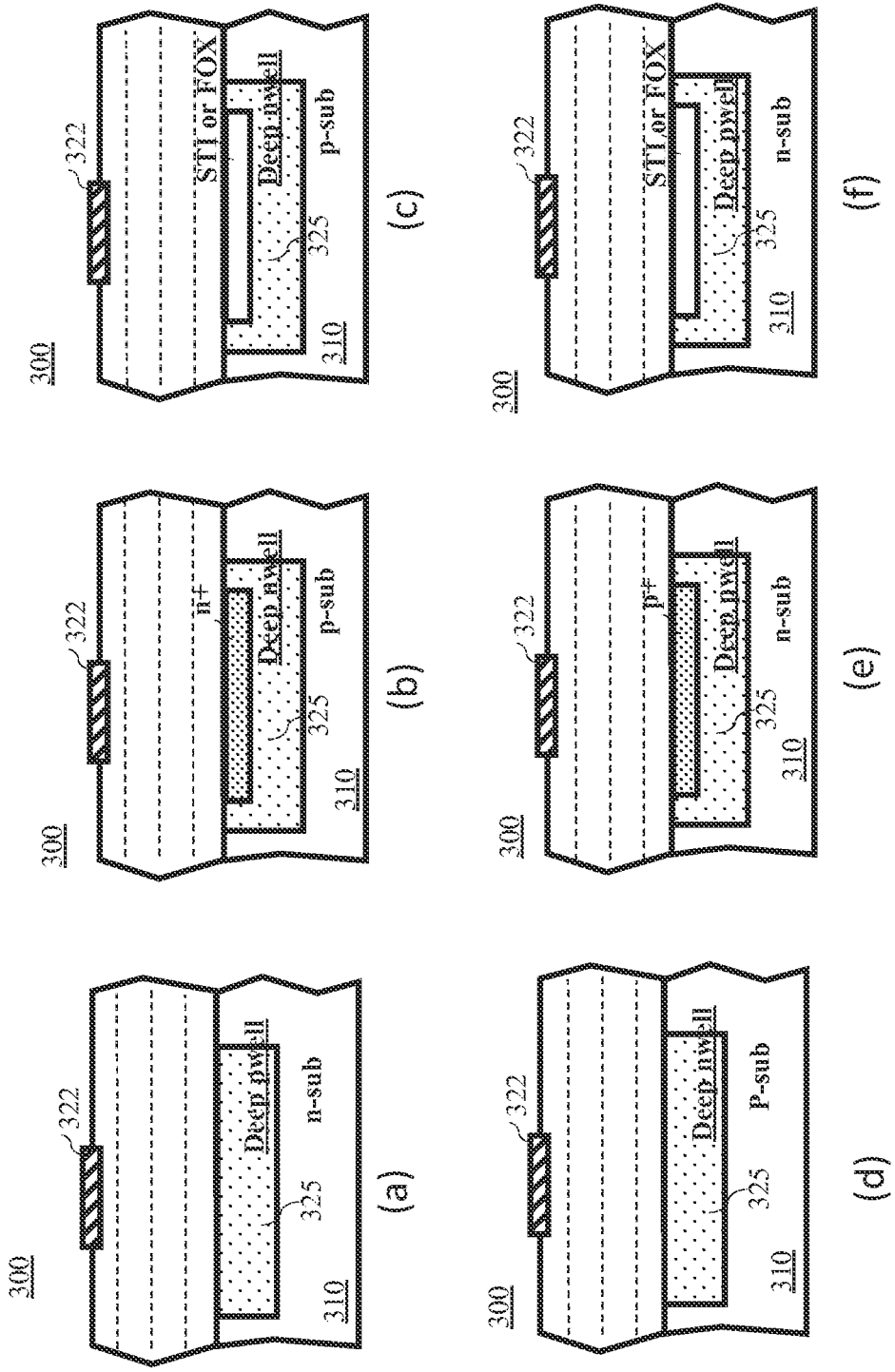
FIG. 3B illustrates second implementation examples of the isolation device using a deep well.

FIG. 3B illustrates second implementation examples of the isolation device 300 using deep well. FIG. 3B (a) shows an isolation device 300 formed using a metal layer 322 and a deep p-well 325 to form a capacitor 320. The semiconductor substrate 310 may be an n-type substrate. FIG. 3B (b) shows an isolation device 300 formed using a metal layer 322 and an n-type active region 325 to form a capacitor 320. The semiconductor substrate 310 may be a p-type substrate. The n-type active region may be surrounded by a deep n-well. The isolation device 300 shown in FIG. 3B(c) may be substantially similar to the isolation device 300 shown in FIG. 3B (b) but with an additional trench isolation layer (STI) or field oxide layer (FOX) formed within the deep n-well of the semiconductor substrate 310. In FIG. 3B (d), the isolation device 300 may be formed using a metal layer 322 and a deep n-well 325 to form a capacitor 320 on a p-type substrate 310. FIG. 3B (e) shows an isolation device 300 formed using a metal layer 322 and a p-type active region 325 to form a capacitor 320. The semiconductor substrate 310 may be an n-type substrate. The n-type active region may be surrounded by a deep p-well. The isolation device 300 shown in FIG. 3B (f) may be substantially similar to the isolation device 300 shown in FIG. 3B (e) but with an additional trench isolation layer or field oxide layer formed within the deep p-well of the semiconductor substrate 310.

Figure 4A:
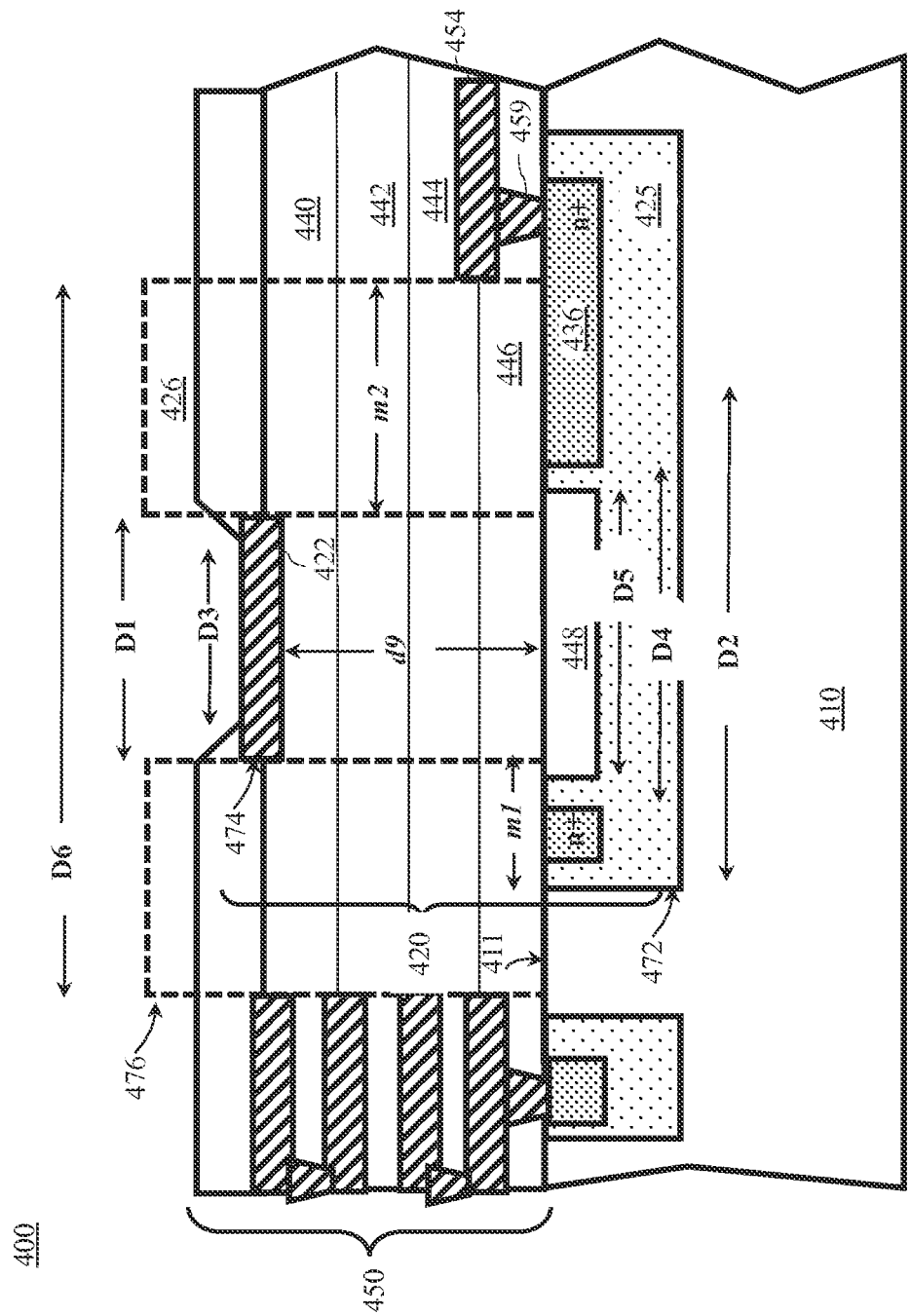
FIG. 4A illustrates a cut-away cross sectional view of an isolation device having an active region.
Figure 4B:
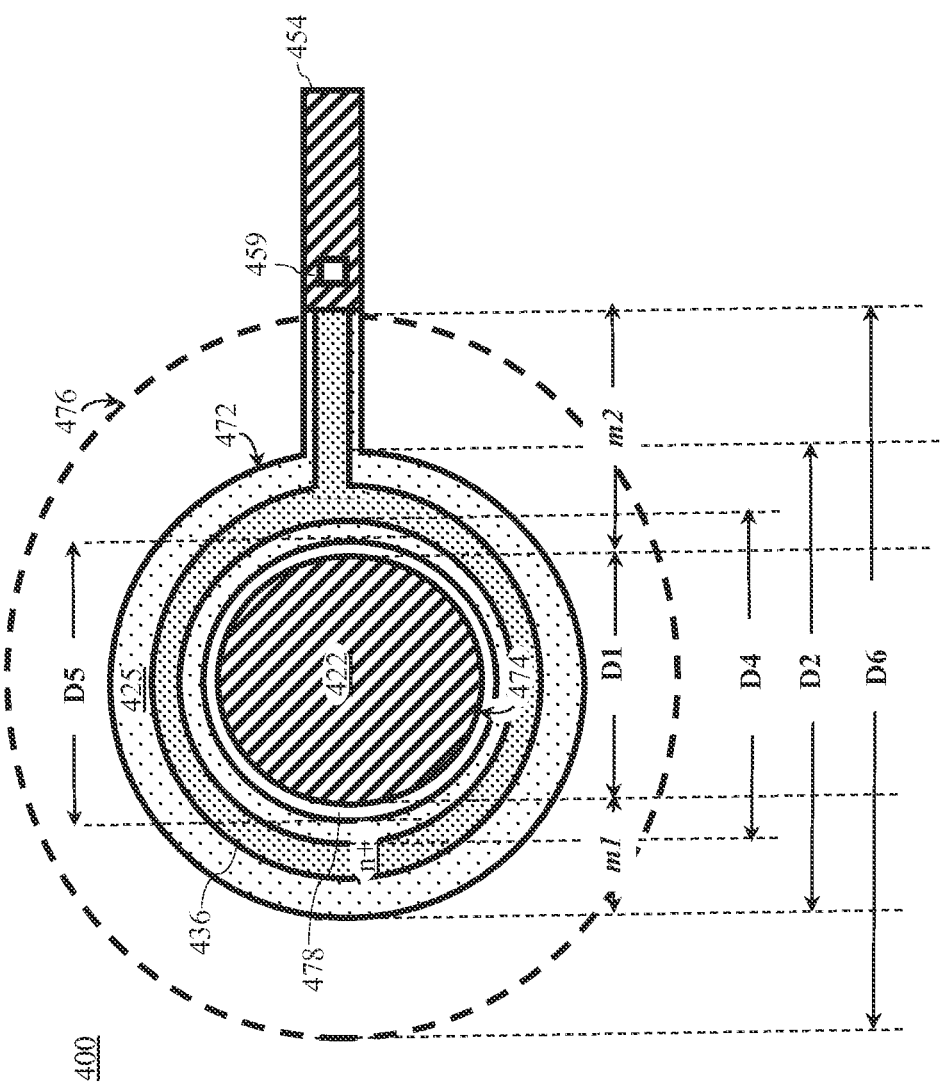
FIG. 4B illustrates a top view of the isolation device shown in FIG. 4A.
Figure 4C:
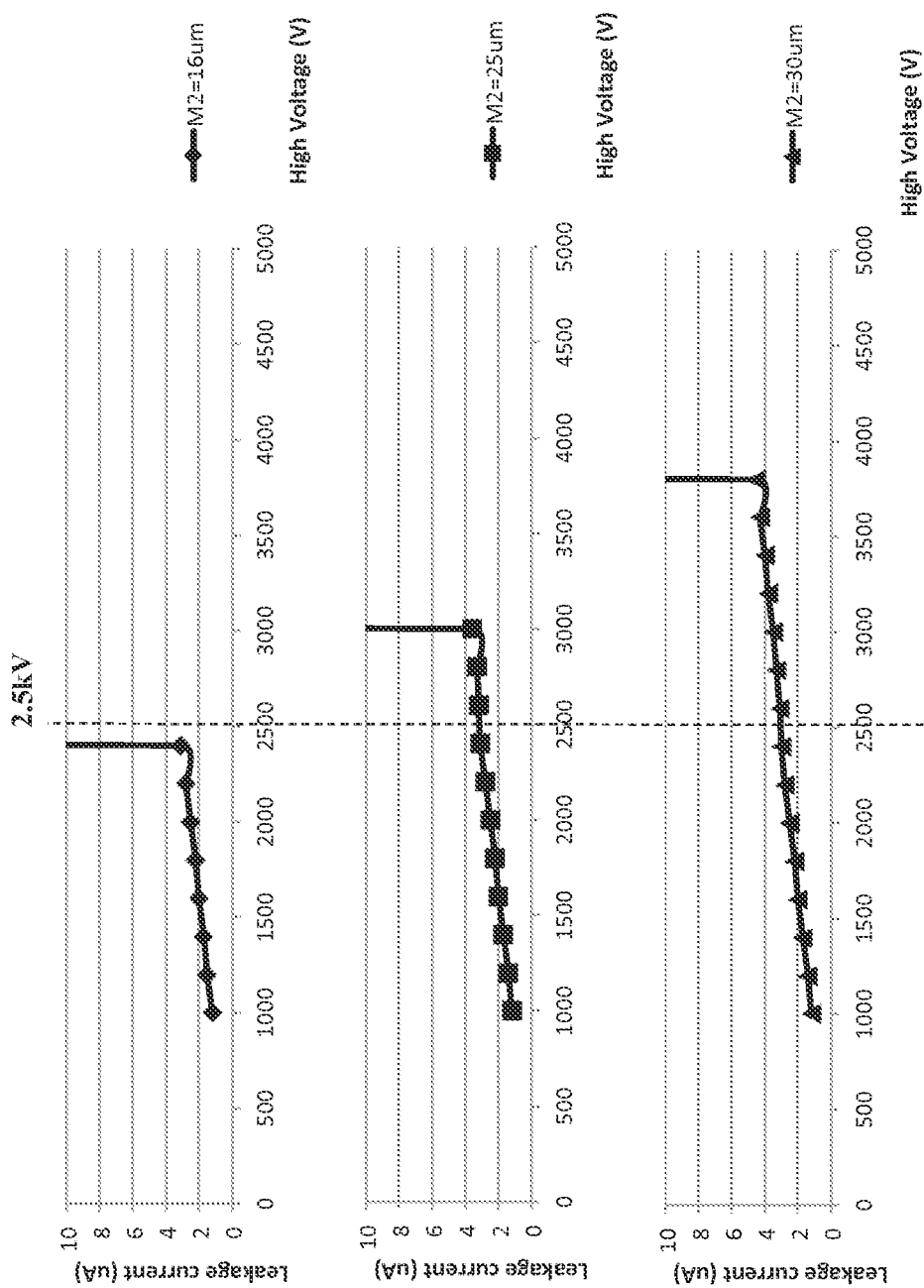
FIG. 4C illustrates a measurement result of the isolation device under high voltage.

FIG. 4A illustrates an illustrative cross sectional view of an isolation device 400 having an active region 436. The isolation device 400 may comprise a semiconductor substrate 410, a plurality of isolation layers 440-446, and a plurality of metal layers 450. FIG. 4B illustrates a top view of the isolation device 400 shown in FIG. 4A. FIG. 4C illustrates a measurement result of the isolation device 400 under high voltage. Referring to FIGS. 4A-4B, the isolation device 400 may comprise an isolation capacitor 420 formed using a metal plate 422 and a conductive layer 425. The metal plate 422 may be a topmost metal layer of the plurality of metal layers 450. The plurality of isolation layers 440-446 may be sandwiched between the metal plate 422 and the conductive layer 425. A trench isolation layer 448 may be embedded within the conductive layer 425. The trench isolation layer 448 may be a shallow trench isolation layer or a deep trench isolation layer or a field oxide layer. The isolation device 400 may further comprise an isolation zone 426 surrounding the metal plate 422. The isolation zone 426 may be a region adjacent to the conductive layer 425 devoid of the conductive material such as the plurality of metal layers 450. The isolation zone 426 may comprise substantially isolating material. The isolation zone 426 may have an outer perimeter or a zone perimeter 476 as shown in FIG. 4B.

The isolation device 400 may be substantially similar to the isolation device 200 but may differ at least in that the conductive layer 425 may comprise an active region 436. The active region 436 may be formed surrounding the trench isolation layer 448. The active region 436 may be a highly doped region, which may be formed at least partially within the conductive layer 425. The active region 436 may have similar polarity relative to the conductive layer 425. For example, the conductive layer 425 may be an n-well, and thus, the active region 436 may be an n-active region. The active region 436 may be configured to reduce resistance within the conductive layer 425. Optionally, as shown in FIG. 4B, the active region 436 may be a closed ring shape.

The metal plate 422 and the conductive layer 425 may have a substantially circular shape. The metal plate 422 may have a diameter of D1 measuring on an outer perimeter designated herein after as a plate perimeter 474. A portion of the metal plate 422 exposed externally may have a diameter of D3. The conductive layer 425 may have a diameter of D2 extending between an outer perimeter designated hereinafter as layer perimeter 472. In addition, the isolation zone 426 may have a diameter D6 extending between an outer perimeter designated hereinafter as zone perimeter 476. However, a portion of the conductive layer 425 may extend beyond the layer perimeter 472. As shown in FIG. 4A and FIG. 4B, a portion of the active region 436 and the conductive layer 425 may extend beyond the isolation zone 426 and electrically coupled to a first deepest buried metal layer 454 through a "via" 459. The first deepest buried metal layer 454 may be one of the plurality of metal layers 450 positioned closest relative to the substrate 410. The trench isolation layer 448 may be substantially circular having a diameter of D5. Similarly, the active region 436 may define a substantially circular shape with a diameter of D4. Approximate relation between the diameters D1-D5 may be substantially described using the following equation (3)

$$D6>D2>D4>D5 \geq D1>D3 \qquad \text{Equation(3)}$$

The size or diameter of trench isolation layer 448 may be approximately equal to or larger than the metal plate 422, so that the capacitively coupled signal emitted by the metal plate 422 may be received by a substantial portion of the conductive layer 425 embedded within the substrate surface 411. Hence, the diameter D5 of the trench isolation layer 448 may be approximately equal to or larger than the diameter D1 of the metal plate 422. The metal plate 422 may be configured to receive a wire bond and thus, the diameter D1 of the metal plate 422 may be more than approximately 10 um. The size of the metal plate 422 may be estimated based on the capacitance value needed as approximately described by using equation (1).

The active region 436 may be configured to extract electrical charges from the conductive layer 425. However, as the active region 436 may be formed on the substrate surface 411, the active region 436 may be position adjacent to the trench isolation layer 448. The diameter D4 of the active region 436 may be larger than the diameter D5 of the trench isolation layer 448. Optionally, the active region 436 may be at least half micron away from the trench isolation layer 448, and thus, the diameter D4 of the active region 436 may be at least one micron more compared to the diameter D5 of the trench isolation layer 448.

The conductive layer 425 may be at least approximately a half-micron away from the active region 436 and thus, the diameter D2 of the conductive layer 425 may be at least approximately one micron more compared to the diameter D4 of the active region 436. However, in order to capture substantial electric flux generated from the plate perimeter 474, the diameter D2 of the conductive layer 425 may be at least approximately ten microns more relative to the diameter D1 of the metal plate 422. In other words, the layer perimeter 472 of the conductive layer 425 may extend at least approximately five microns outwardly relative to the plate perimeter 474. Generally, the layer perimeter 472 of the conductive layer 425 may extend beyond the plate perimeter 474 of the metal plate 422 by a margin m1. In the embodiment shown in FIG. 4A, the margin m1 may be approximately equal to or larger than five microns.

The metal plate 422 and the substrate 410 may be distanced apart by d9. The distance d9 between the metal plate 422 and the substrate 410 may be approximately between four microns and twelve microns. In another embodiment, the distance d9 between the metal plate 422 and the substrate 410 may be approximately between four microns and twenty microns. The margin m1 or the distance between the plate perimeter 474 and the layer perimeter 472 may be substantially correlated to the distance d9 between the metal plate 422 and the substrate 410. For example, in the embodiment shown in FIG. 4A, the margin m1 or the distance between the plate perimeter 474 and the layer perimeter 472 may be approximately more than half the distance d9 between the metal plate 422 and the substrate 410. In another embodiment, the margin m1 or the distance between the plate perimeter 474 and the layer perimeter 472 may be approximately more than the distance d9 between the metal plate 422 and the substrate 410. In yet another embodiment, the margin m1 or the distance between the plate perimeter 474 and the layer perimeter 472 may be approximately more than two times the distance d9 between the metal plate 422 and the substrate 410. The selection of d9 and its relation with the margin m1 above may contribute towards higher tolerance to breakdown of the isolation capacitor 420 and towards capacitance value of the isolation capacitor.

Generally, the layer perimeter 472 of the conductive layer 425 may extend beyond the zone perimeter 476 of the isolation zone 426 by a margin m2 measuring from plate perimeter 474 of the metal plate 422. In the embodiment shown in FIG. 4A, the margin m2 may be equal to or larger than twenty microns. Measurement results with substantially similar isolation device 400 having different values of the margin m2 are shown in FIG. 4C. Referring to FIG. 4C, the isolation device 400 may breakdown below approximately 2.5 kV when the margin m2 may be approximately sixteen microns, However, when the margin m2 is approximately thirty microns, the breakdown voltage of the isolation device 400 may be more than approximately 3.5 kV.

The distance between the "via" 459 and the plate perimeter 474 of the metal plate 422 may be more than the margin m2, which may be more than twenty microns in the embodiment shown in FIG. 4A. The distance d9 between the metal plate 422 and the substrate 410 in the embodiment shown in FIG. 4A may be less than seven microns. Although the distance d9 between metal plate 422 and the substrate 410 may be shorter compared to the distance between the 'via' 459 and the plate perimeter 474, breakdown of the isolation device 400 may occur near the "via" 459 instead of between the metal plate 422 and the conductive layer 425. This may be due to the reason that the "via" 459 and the first deepest buried metal layer 454 may have pointed edges or structures that attract electrical flux from the metal plate 422.

Figure 5:
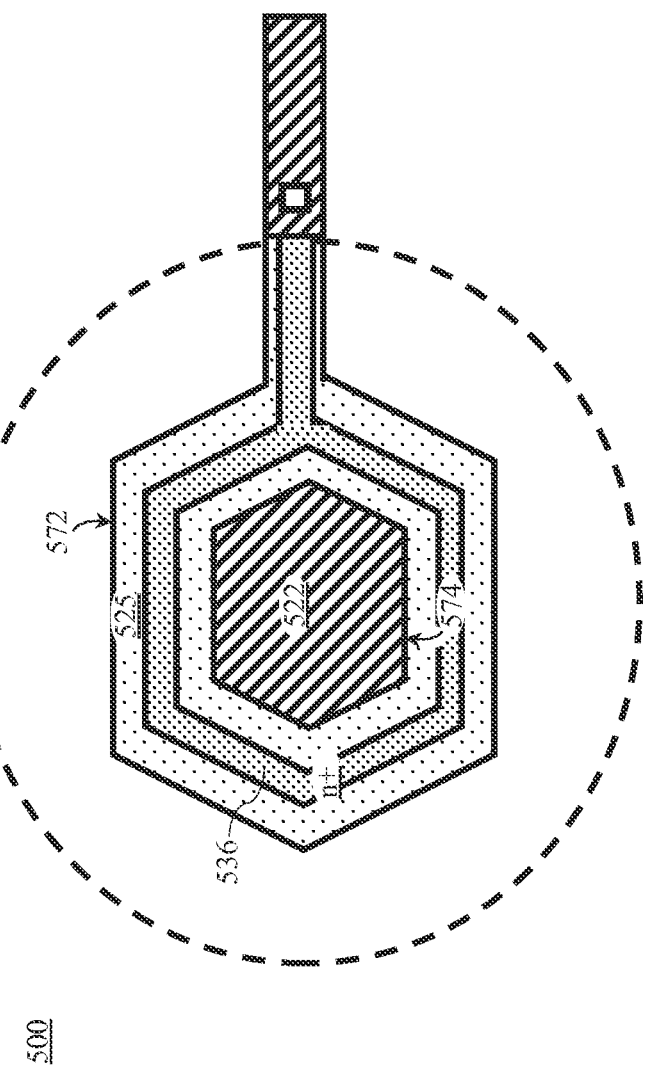
FIG. 5 illustrates a top view of an isolation device having heptagon shape.

FIG. 5 illustrates a top view of an isolation device 500. The isolation device 500 may comprise a metal plate 522 and a conductive layer 525. The conductive layer 525 may comprise an active region 536. The isolation device 500 may be substantially similar to the isolation device 400 shown in FIG. 4A but differs at least in that the shape of the isolation device 500 may be substantially heptagonal.

FIG. 6 illustrates an illustrative view of an isolation system 600. The isolation system 600 may comprise a first circuit 665 integrated substantially in a first die 601, a second circuit 661 integrated substantially in a second die 602. Each of the first and second dies 601, 602 may comprise a plurality of metal layers (not shown), a conductive layer 625 and a substrate 610 respectively as illustrated in various previous embodiments. The first die 601 may be electrically coupled to the second die 602. For example, as shown in FIG. 6, the second die 602 may be arranged in a flip chip arrangement and electrically coupled to the first die 601 through solder bump 660. Optionally, the second die 602 may be electrically coupled to the first die 601 through a wire bond.

The first die 601 may comprise an isolation capacitor 620. The isolation capacitor 620 may comprise a first capacitive plate 622 and a second capacitive plate 625. The first capacitive plate 622 and the second capacitive plate 625 may be interposing at least two layers of isolation layer 640 configured to electrically isolate the first capacitive plate 622 and the second capacitive plate 625. In another embodiment, more than two layers of the isolation layer 640 may be interposed between the first capacitive plate 622 and the second capacitive plate 625. The first capacitive plate 622 may be a topmost metal layer of the plurality of metal layers electrically coupled to the second circuit 661 through the solder bump 660. Alternatively, the first capacitive plate 622 may be an additional metal layer (not shown) electrically coupled to the topmost metal layer. The second capacitive plate 625 may comprise a conductive layer 625, which may be substantially more conductive than the substrate 610 of the first die 601. For example, the second capacitive plate 625 may be n-well, p-well, n-active, p-active or poly-silicon layer embedded within the substrate 610. Optionally, the second capacitive plate 625 may be a first deepest buried metal layer or a poly-silicon layer positioned less than one micron away from the substrate 610.

The second capacitive plate 625 may be arranged approximating the first capacitive plate 622 on opposing sides of the at least two isolation layers 640, so as to receive a capacitively coupled signal 624 from the first capacitive plate 622. The capacitively coupled signal 624 may be responsive to a signal 662 generated from the second circuit 661. In another embodiment, the signal 662 may be a bi-directional signal capable of being transmitted from the first circuit 665 to the second circuit 661, or from the second circuit 661 to the first circuit 665. The capacitively coupled signal 624 may comprise electric flux emitted from the first capacitive plate 622. The first capacitive plate 622 may have an outer perimeter 674 and the second capacitive plate is relatively larger than the first capacitive plate so as to capture a substantial amount of the electrical flux 624 emitted from the outer perimeter 674 of the first capacitive plate 622. As explained in previous embodiment, the outer perimeter 674 of the first capacitive plate 622 may extend at least approximately five microns beyond the outer perimeter 674 of the first capacitive plate 622.

The first circuit 665 may be configured to operate approximately within a first voltage range, $V_{range1}$ as shown in the graph on the right, whereas the second circuit 661 may be configured to operate approximately within a second voltage range, $V_{range2}$ as shown in the graph on the left. The second voltage range $V_{range2}$ may be substantially different from the first voltage range $V_{range1}$. For example, as shown in FIG. 6, the second voltage range $V_{range2}$ may be substantially larger than the first voltage range $V_{range1}$. The isolation capacitor 620 shown in FIG. 6 may be implemented using various capacitors shown in FIG. 1, FIGS. 2A-2E, FIGS. 3A-3B, FIGS. 4A-4B and FIG. 5. Alternatively, the isolation capacitor 620 may be of other structures shown in FIG. 7A and FIG. 8A where the second conductive plate 625 may be formed above the substrate 610.

Figure 7A:
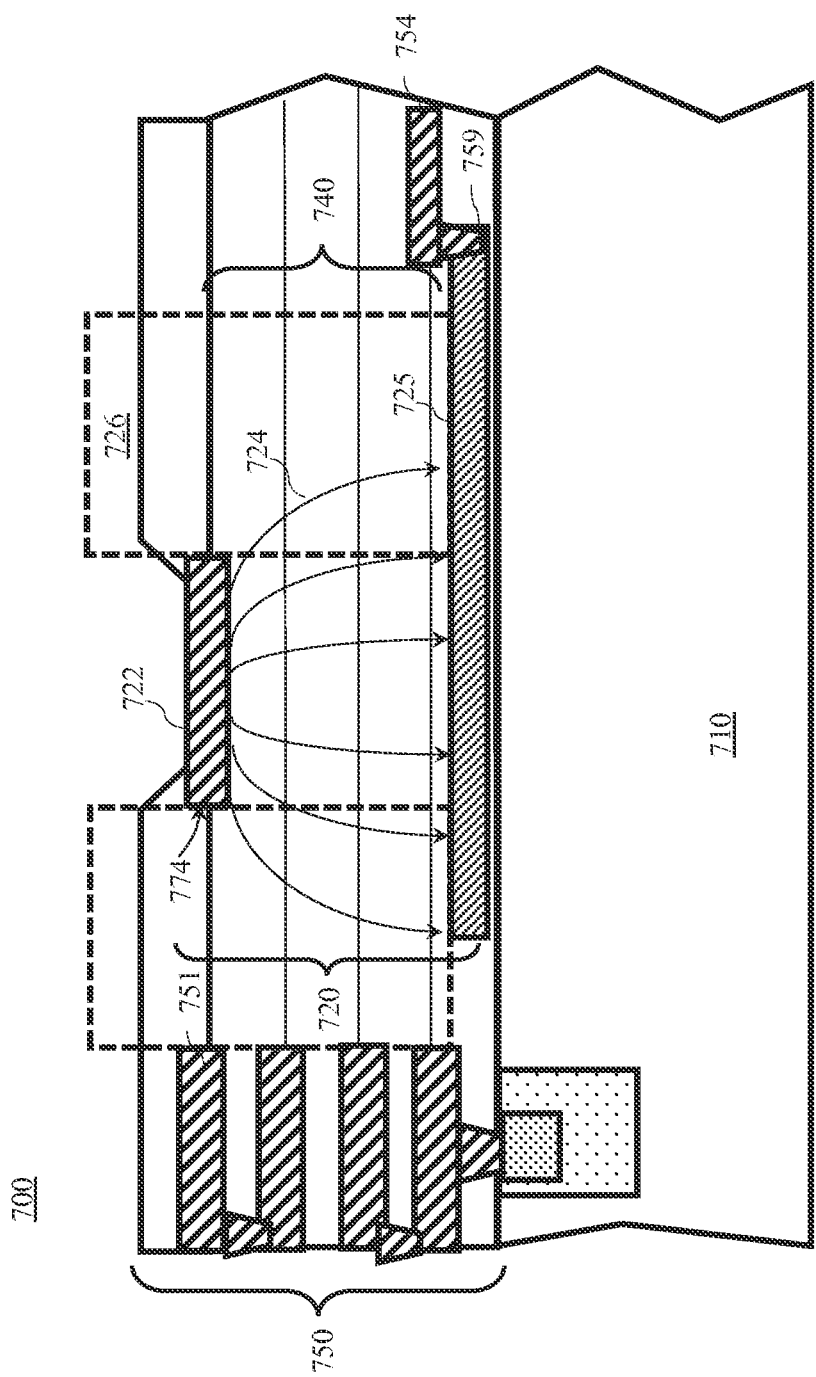
FIG. 7A illustrates a cut-away cross sectional view of an isolation device having an isolation capacitor comprising poly-silicon layer.
Figure 7B:
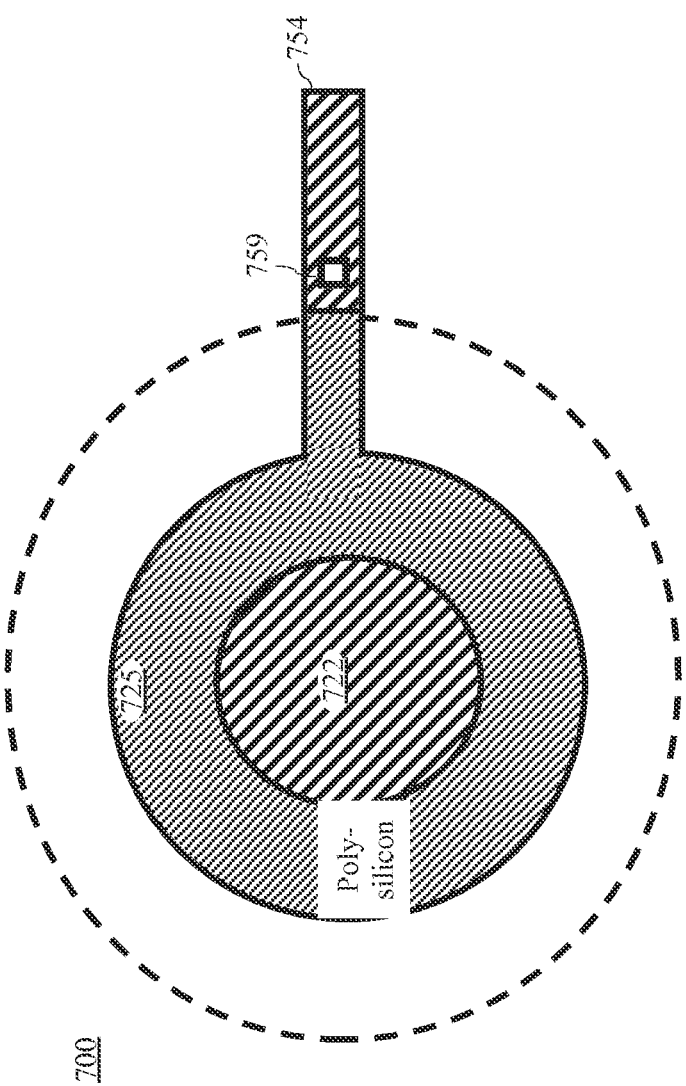
FIG. 7B illustrates a top view of the isolation device shown in FIG. 7A.

FIG. 7A illustrates a cut-away cross sectional view of an isolation device 700. FIG. 7B illustrates a top view of the isolation device 700 shown in FIG. 7A. Referring to FIG. 7A and FIG. 7B, the isolation device 700 may comprise an isolation capacitor 720. The isolation device 700 may comprise a substrate 710, a plurality of metal layers 750 and a poly-silicon layer 725. The plurality of metal layers 750 may comprise a topmost metal layer 751, a first deepest buried metal layer 754. The topmost metal layer 751 may be a metal layer that is positioned furthest away relative to the substrate 710 whereas the first deepest buried metal layer 754 may be a metal layer that is positioned closest relative to the substrate 710.

The isolation capacitor 720 may comprise a first capacitive plate 722 formed using one of the plurality of metal layers 750, and a second capacitive plate 725 formed using the poly-silicon layer 725. The first and second capacitive plates 722, 725 may be interposing two or more layers of the isolation layers 740. The poly-silicon layer 725 may be electrically coupled to the first deepest buried metal layer 754 through a "via" 759. The first and second capacitive plates 722, 725 may be arranged approximating each other on opposing sides of the plurality of isolation layers 740 such that a capacitively coupled signal 724 may be received by the second capacitive plate 725. The second capacitive plate 725 may be substantially larger than the first capacitive plate 722 such that a substantial portion of the capacitively coupled signal 724 emitted from an outer perimeter 774 may be received.

The isolation device 700 may comprise an isolation zone 726 adjacent to the second capacitive plate 725. The isolation zone 726 may be an area devoid of conductive material such as the plurality of metal layers 750. The second capacitive plate 725 may be formed less than one micron away from the substrate 710. As the second capacitive plate 725 may be distanced away from the substrate 710, the isolation zone 726 may also be distanced away from the substrate 710. The first deepest buried metal layer 754 and the "via" 759 may be at least approximately twenty microns away from the outer perimeter 774 of the first capacitive plate 722.

Figure 8B:
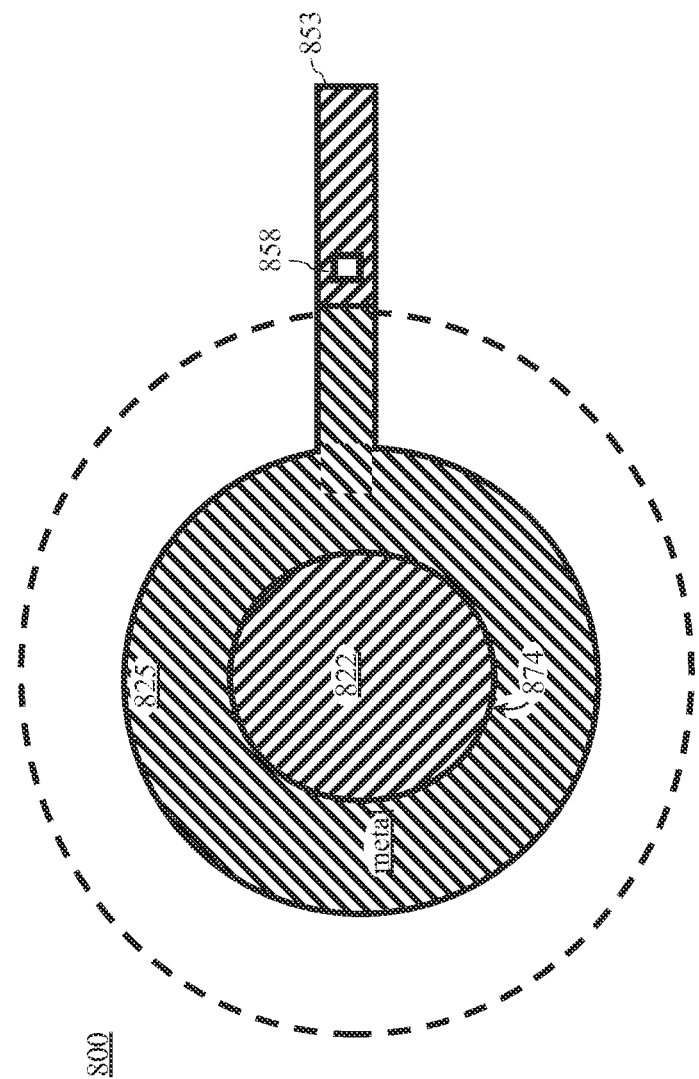
FIG. 8B illustrates a top view of the isolation device shown in FIG. 8A.

FIG. 8A illustrates a cut-away cross sectional view of an isolation device 800. FIG. 8B illustrates a top view of the isolation device 800 shown in FIG. 8A. Referring to FIG. 8A and FIG. 8B, the isolation device 800 may comprise an isolation capacitor 820. The isolation device 800 may comprise a substrate 810 and a plurality of metal layers 850. The plurality of metal layers 850 may comprise a topmost metal layer 851, a first deepest buried metal layer 854, an additional metal layer 853 positioned closest to the first deepest buried metal layer 854. The topmost metal layer 851 may be a metal layer that is positioned furthest away relative to the substrate 810 whereas the first deepest buried metal layer 854 may be a metal layer that is positioned closest relative to the substrate 810. The additional metal layer 853 may be the second closest metal layer relative to the substrate 810.

The isolation capacitor 820 may comprise a first capacitive plate 822 formed using one of the plurality of metal layers 850, and a second capacitive plate 825 formed using the first deepest buried metal layer 854. The first and second capacitive plates 822, 825 may be interposing two or more layers of the isolation layers 840. The first and second capacitive plates 822, 825 may be arranged approximating each other on opposing sides of the plurality of isolation layers 840 such that a capacitively coupled signal 824 may be received by the second capacitive plate 825. The second capacitive plate 825 may be substantially larger than the first capacitive plate 822 such that a substantial portion of the capacitively coupled signal 824 emitted from an outer perimeter 874 may be received.

The isolation device 800 may comprise an isolation zone 826 adjacent to the second capacitive plate 825. The isolation zone 826 may be an area devoid of conductive material such as the plurality of metal layers 850. The second capacitive plate 825 may be formed less than one micron away from the substrate 810. As the second capacitive plate 825 may be distanced away from the substrate 810, the isolation zone 826 may be distanced away from the substrate 810. The first deepest buried metal layer 854 and the "via" 859 may be at least twenty microns away from the outer perimeter 874 of the first capacitive plate 822. The second capacitive plate 825 may be electrically coupled to the additional metal layer 853 through a "via" 858 outside the isolation zone 826.

Figure 9:
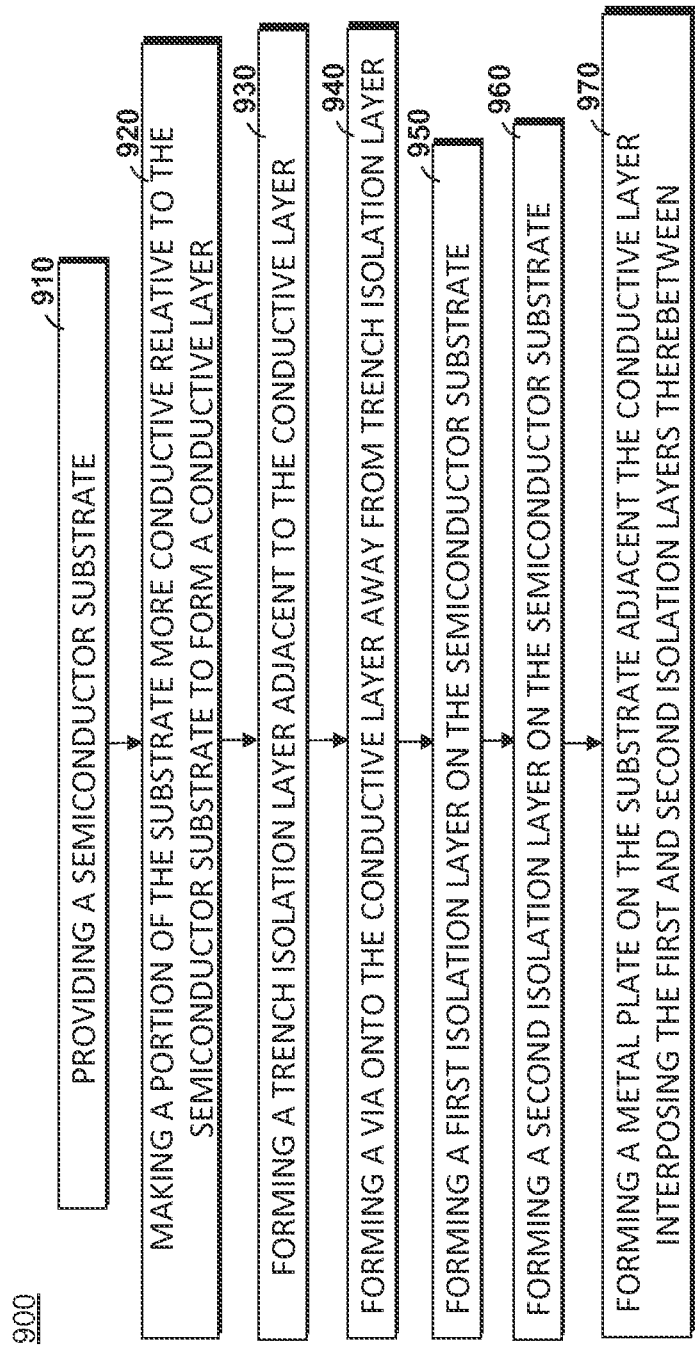
FIG. 9 illustrates a flow chart showing a method for making an isolation capacitor.

FIG. 9 illustrates a flow chart showing a method 900 for making an isolation capacitor. In step 910, a semiconductor substrate may be provided. Next, in step 920, a portion of the substrate may be made more conductive relative to the semiconductor substrate to form a conductive layer. In next optional step 930, a trench isolation layer may be formed adjacent to the conductive layer. In step 940, a "via" may be formed onto the conductive layer at least twenty-five microns away from the trench isolation layer. In step 950, a first isolation layer may be formed on the semiconductor substrate whereas in step 960, a second isolation layer may be formed on the semiconductor substrate. In step 970, a metal plate may be formed adjacent to the conductive layer interposing first and second isolation layers to form an isolation capacitor.

Different aspects, embodiments or implementations may, either individually and/or in combination, but need not, yield one or more of the following advantages. For example, the specific dimension in various embodiments may contribute towards higher breakdown voltage. Similarly, the specific shape and arrangement discussed in various embodiments may also contribute towards higher breakdown voltage and/or space efficiency.

Although different aspects have been presented in each embodiment, all or part of the different aspects illustrated in each embodiment may be combined. Various embodiments of the invention are contemplated in addition to those disclosed hereinabove. For example, a "plate" discussed above may or may not be flat, and may not be made from metallic material unless otherwise stated. Although specific embodiments of the invention have been described and illustrated, the invention is not to be limited to the specific forms or arrangements of parts so described and illustrated. For example, the equations disclosed above may be for first order estimation for illustration purpose. In reality, the actual performance may be deviated from the equations illustrated. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention. It is to be understood that the illustration and description shall not be interpreted narrowly.

What is claimed is:

1. An isolation capacitor, comprising:
    a first capacitive element in electrical communication with a first circuit and having a first area;
    a second capacitive element in electrical communication with a second circuit that operates at a different voltage than the first circuit, wherein the second capacitive element comprises a second area that is different from the first area, wherein the second capacitive element comprises a conductive element formed on or near a top surface of a substrate, wherein the substrate further comprises at least one metal layer that is included in the second circuit, and wherein the second capacitive element is electrically connected to the at least one metal layer through at least one via; and
    at least one isolation layer disposed on the substrate and positioned between the first capacitive element and the second capacitive element, wherein the at least one isolation layer substantially prohibits electrical current from flowing between the first capacitive element and the second capacitive element, thereby maintaining an electrical isolation between the first circuit and second circuit, and wherein the at least one isolation layer allows a capacitively coupled signal to travel between the first capacitive element and the second capacitive element thereby enabling communication between the first circuit and second circuit even though the first circuit and second circuit are electrically isolated from one another;
    wherein a trench isolation layer is provided between the second capacitive element and the first capacitive element, wherein the trench isolation layer comprises a top surface that is substantially parallel with the top surface of the substrate, and wherein at least a portion of the second capacitive element that is aligned with the first capacitive element is buried in the substrate and covered by the trench isolation layer.

2. The isolation capacitor of claim 1, wherein the first area of the first capacitive element is smaller than the second area of the second capacitive element.

3. The isolation capacitor of claim 2, wherein the first area of the first capacitive element dictates a capacitance between the first capacitive element and the second capacitive element.

4. The isolation capacitor of claim 2, wherein a center of the first area is substantially aligned with a center of the second area.

5. The isolation capacitor of claim 2, wherein at least one of the first area and second area are at least one of circular and elliptical.

6. The isolation capacitor of claim 1, wherein the at least one isolation layer comprises a first isolation layer and a second isolation layer.

7. The isolation capacitor of claim 1, wherein the first capacitive element comprises a metal plate, wherein the second capacitive element comprises at least one of an n-well, a p-well, an n-active region, or a p-active region, and wherein the second capacitive element comprises a conductive layer formed in the substrate.

8. The isolation capacitor of claim 1, wherein a distance between the first capacitive element and the second capacitive element is greater than a thickness of the at least one isolation layer.

9. The isolation capacitor of claim 1, wherein the first circuit operates at a voltage that is at least 2 kV larger than a voltage at which the second circuit operates.

10. The isolation capacitor of claim 1, wherein the second capacitive element is at least partially formed from a portion of the substrate.

11. The isolation capacitor of claim 1, wherein the conductive element extends outwardly beyond an isolation zone that isolates the first capacitive element from the at least one metal layer.

12. The isolation capacitor of claim 11, wherein the isolation zone comprises a substantially insulating material.

13. An isolation system, comprising:
a first circuit operating at a first voltage range;
a second circuit operating at a second voltage range that is different from the first voltage range, wherein the second circuit comprises one or more metal layers established on a substrate; and
a capacitive isolator that electrically isolates the first circuit from the second circuit while also enabling control signals to pass between the first circuit and second circuit in the form of electrical flux, wherein the capacitive isolator comprises:
  a first capacitive element in electrical communication with the first circuit and formed adjacent to the one or more metal layers;
  a second capacitive element positioned in an overlapping arrangement with the first capacitive element and in electrical communication with the one or more metal layers of the second circuit, wherein the second capacitive element is at least partially formed in the substrate; and
  an isolation layer positioned between the first capacitive element and the second capacitive element, wherein the isolation layer substantially prevents current from flowing directly between the first capacitive element and the second capacitive element, but enables the electrical flux to pass between the first capacitive element and the second capacitive element,
wherein the first capacitive element, second capacitive element, isolation layer, and the one or more metal layers of the second circuit are formed on and supported by the substrate, and
wherein the isolation layer comprises one or more isolation layers that are interposed between the one or more metal layers.

14. The isolation system of claim 13, wherein the second capacitive element is fully formed in the substrate.

15. The isolation system of claim 14, wherein the substrate comprises a silicon integrated circuit chip.

16. The isolation system of claim 15, wherein the capacitive isolator further comprises a trench isolation layer having a top surface that is substantially coplanar with a top surface of the substrate and wherein the trench isolation layer is positioned between the first capacitive element and the second capacitive element.

17. The isolation system of claim 13, wherein an area of the first capacitive element is different from an area of the second capacitive element.

18. The isolation system of claim 17, wherein a center of the first capacitive element is positioned substantially over a center of the second capacitive element.

19. A method of operating a capacitive isolator, comprising:
receiving electrical current at a first capacitive element having a first area, wherein the first electrical current is received from a first circuit operating at a first voltage range;
converting the first electrical current into electric flux at the first capacitive element;
transmitting the electric flux across an isolation layer and a trench isolation layer that electrically isolate the first capacitive element from a second capacitive element and thereby electrically isolate the first circuit from a second circuit operating at a second voltage range that is different from the first voltage range;
receiving the electric flux at the second capacitive element, wherein the second capacitive element comprises a second area that is different from the first area of the first capacitive element; and
converting the electric flux received at the second capacitive element into second current that is provided to the second circuit,
wherein the second capacitive element comprises a conductive element formed on or near a top surface of a substrate,
wherein the substrate further comprises the isolation layer disposed thereon along with at least one metal layer that is included in the second circuit,
wherein the second capacitive element is electrically connected to the at least one metal layer through at least one via,
wherein the trench isolation layer is provided between the second capacitive element and the first capacitive element,
wherein the trench isolation layer comprises a top surface that is substantially parallel with the top surface of the substrate, and
wherein at least a portion of the second capacitive element that is aligned with the first capacitive element is buried in the substrate and covered by the trench isolation layer.

20. The method of claim 19, wherein the first voltage range is at least 2 kV larger than the second voltage range.

* * * * *